United States Patent
Kim et al.

(10) Patent No.: US 12,356,772 B2
(45) Date of Patent: Jul. 8, 2025

(54) METHOD OF IMPROVING PERFORMANCE OF DEVICES WITH QDS COMPRISING THIN METAL OXIDE COATINGS

(71) Applicant: Shoei Chemical Inc., Tokyo (JP)

(72) Inventors: Daekyoung Kim, Santa Clara, CA (US); Wenzhou Guo, San Jose, CA (US); Diego Barrera, San Jose, CA (US); Ruiqing Ma, Morristown, NJ (US)

(73) Assignee: SHOEI CHEMICAL INC., Tokyo (JP)

( * ) Notice: Subject to any disclaimer, the term of this patent is extended or adjusted under 35 U.S.C. 154(b) by 919 days.

(21) Appl. No.: 17/370,218

(22) Filed: Jul. 8, 2021

(65) Prior Publication Data
US 2022/0077354 A1 Mar. 10, 2022

Related U.S. Application Data

(60) Provisional application No. 63/049,387, filed on Jul. 8, 2020.

(51) Int. Cl.
| | |
|---|---|
| *C09K 11/02* | (2006.01) |
| *C09K 11/08* | (2006.01) |
| *C09K 11/56* | (2006.01) |
| *C09K 11/70* | (2006.01) |
| *C09K 11/88* | (2006.01) |
| *H10H 20/01* | (2025.01) |
| *H10H 20/851* | (2025.01) |

(52) U.S. Cl.
CPC ....... *H10H 20/8513* (2025.01); *C09K 11/025* (2013.01); *C09K 11/0883* (2013.01); *C09K 11/565* (2013.01); *C09K 11/70* (2013.01); *C09K 11/883* (2013.01); *H10H 20/01* (2025.01); *H10H 20/0361* (2025.01)

(58) Field of Classification Search
CPC ... C09K 11/00; C09K 11/0883; C09K 11/565; C09K 11/70; C09K 11/883
See application file for complete search history.

(56) References Cited

U.S. PATENT DOCUMENTS

| | | |
|---|---|---|
| 2010/0163798 A1 | 7/2010 | Ryowa et al. |
| 2010/0283005 A1 | 11/2010 | Pickett et al. |

(Continued)

FOREIGN PATENT DOCUMENTS

| | | |
|---|---|---|
| EP | 2171016 B1 | 9/2013 |

OTHER PUBLICATIONS

Kim, Y., et al., "Bright and Uniform Green Light Emitting InP/ZnSe/ZnS Quantum Dots for Wide Color Gamut Displays," *ACS Appl. Nano Mater.* 2(3):1496-1504, American Chemical Society, United States (2019).

(Continued)

*Primary Examiner* — Matthew E. Hoban
(74) *Attorney, Agent, or Firm* — Alleman Hall & Tuttle LLP

(57) ABSTRACT

The invention is in the field of nanostructure synthesis. Provided are highly luminescent nanostructures, particularly highly luminescent quantum dots, comprising a nanocrystal core/shell and a thin metal oxide on the outer shell of the nanostructure. Also provided are methods of preparing the nanostructures, films comprising the nanostructures, and devices comprising the nanostructures.

9 Claims, 8 Drawing Sheets

(56) References Cited

U.S. PATENT DOCUMENTS

| | | | | |
|---|---|---|---|---|
| 2011/0006281 | A1* | 1/2011 | Jang | C09K 11/565 |
| | | | | 252/500 |
| 2017/0306227 | A1* | 10/2017 | Ippen | C09K 11/70 |
| 2021/0040387 | A1* | 2/2021 | Hong | C09K 11/883 |
| 2021/0222064 | A1* | 7/2021 | Zhang | B05D 3/0254 |
| 2022/0177777 | A1* | 6/2022 | Loiudice | C09K 11/616 |

OTHER PUBLICATIONS

Lee, S. H., et al., "The effects of discrete and gradient mid-shell structures on the photoluminescence of single InP quantum dots," *Nanoscale* 11(48):23251-23258, Royal Society of Chemistry, United Kingdom (Nov. 2019).

Lim, J., et al., "Highly efficient cadmium-free quantum dot light-emitting diodes enabled by the direct formation of excitons within InP@ZnSeS quantum dots," *ACS Nano* 7(10):9019-9026, American Chemical Society, United States (Oct. 2013).

Wang, A., et al., "Bright, efficient, and color-stable violet ZnSe-based quantum dot light-emitting diodes," *Nanoscale* 7:2951-2959, Royal Society of Chemistry, United Kingdom (Jan. 2015).

Xiang, C., et al., "The dawn of QLED for the FPD industry," *Information Display* 34(6):14-17, Wiley-Blackwell, United States (Dec. 2018).

* cited by examiner

METHOD OF IMPROVING PERFORMANCE OF DEVICES WITH QDS COMPRISING THIN METAL OXIDE COATINGS

BACKGROUND OF THE INVENTION

Field of the Invention

The invention is in the field of nanostructure synthesis. Provided are highly luminescent nanostructures, particularly highly luminescent quantum dots, comprising a nanocrystal core/shell and a metal oxide on the outer shell of the nanostructure. Also provided are methods of preparing the nanostructures, films comprising the nanostructures, and devices comprising the nanostructures.

Background of the Invention

Tuning the absorbance and emission properties of quantum dots (QDs) for high concentration color conversion applications is critical to their performance. For color conversion applications, efficient absorbance of excitation wavelengths emitted by the blue light emitting diode (LED) backlight is critical to achieving both high photoconversion efficiency (PCE) and high color gamut coverage. Moreover, due to the high optical density of the color conversion layer, controlling other quantum dot optical properties including emission wavelength (PWL), full-width falf-manximum (FWHM), emission linewidth, Stokes shift, and photoluminescence quantum yield (PLQY) are equally critical to PCE and film emission wavelength.

To exploit the full potential of nanostructures in applications such as films and displays, the nanostructures need to simultaneously meet several criteria, including but not limited to: narrow and symmetric emission spectra, high photoluminescence (PL) quantum yields (QYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). For example, quantum dots composed of CdSe or $CsPbBr_3$ are known to possess high per mass absorption coefficients at 450 nm and tunable PWL. However, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for color conversion applications.

A need exists to prepare nanostructures and nanostructure compositions for use in color conversion applications that have high blue light absorption efficiency, controllable emission wavelength, high photoluminescence quantum yield, and narrow FWHM.

BRIEF SUMMARY OF THE INVENTION

Provided is a nanostructure comprising a core/shell nanostructure and a metal oxide on the outer shell of the nanostructure, wherein the outer shell is less than 1 nm thick. In some embodiments, the core comprises Si, Ge, Sn, Se, Te, B, C, P, BN, BP, BAS, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, or combinations thereof. In some embodiments, the core comprises InP. In some embodiments, the shell comprises CdS, CdSe, CdTe, ZnS, ZnSe, ZnTe, MgTe, GaAs, GaSb, GaN, HgS, HgSe, HgTe, InAs, InSb, InN, AlAs, AlN, AlSb, AIS, PbS, PbSe, PbTe, MgS, MgSe, MgTe, CuCl, Ge, Si, or alloys thereof.

In some embodiments, the shell has a thickness of between about 0.2 nm and about 1 nm. In some embodiments, the metal oxide has a thickness of between about 0.3 nm and about 0.9 nm. In some embodiments, the metal oxide has a thickness of between about 0.4 nm and about 0.9 nm. In some embodiments, the metal oxide has a thickness of between about 0.1 nm and about 0.8 nm.

In some embodiments, the shell comprises ZnSe. In some embodiments, the metal oxide comprises CdO, ZnO, HgO, PbO, MgO, InO, GaO, TiO, ZrO, HfO, YO, YbO, IZGO, ZGO, NiO, MoO, CuO, VO, WO or combinations thereof. In some embodiments, the metal oxide comprises ZnO or $ZnO_xSe_{1-x}$.

Also provided is a method of making the nanostructures described herein, comprising:
  (a) admixing a plurality of the core/shell nanostructures and solvent;
  (b) raising the temperature to between about 180° C. and about 360° C.; and
  (c) exposing the composition obtained in (b) to water in an amount that is a molar ratio of 2,000 to 10,000 water:core/shell nanostructures.

In some embodiments, the solvent comprises 1-octadecene, 1-hexadecene, 1-eicosene, eicosane, octadecane, hexadecane, tetradecane, squalene, squalane, trioctylphosphine oxide, trioctylamine, trioctylphosphine, dioctyl ether, or combinations thereof. In some embodiments, the solvent comprises 1-octadecene. In some embodiments, the process further comprising isolating the nanostructures.

In some embodiments, the exposing the composition in (c) to water is by admixing a metal hydrate. In some embodiments, metal hydrate is zinc acetate dihydrate. In some embodiments, the molar ratio of the zinc acetate dihydrate to the core/shell nanostructures range is from about 1000 to about 90000, wherein the QDs size ranges from about 1 nm to 20 nm. In some embodiments, the molar ratio of the zinc acetate dihydrate to the number of QDs is from about 2000 to about 40000, wherein the QDs size ranges from about 1 nm to 15 nm. In some embodiments, the molar ratio of the zinc acetate dihydrate to the number of QDs is from about 2500 to about 9000, wherein the QDs size ranges from about 1 nm to 8 nm. In some embodiments, the molar ratio of the zinc acetate dihydrate to the number of QDs is about 2900, wherein the QDs size is about 5 nm.

In some embodiments, the temperature in (b) is raised to about 270° C.

In some embodiments, the exposing the composition in (c) further comprises admixing a fluoride salt. In some embodiments, the fluoride salt is zinc fluoride, zirconum fluoride, hafnium fluoride, tungsten fluoride, gallium fluoride, lithium fluoride, sodium fluoride, or magnesium fluoride. In some embodiments, the fluoride salt is an ionic liquid. In some embodiments, the wt. ratio of zinc acetate dihydrate to zinc fluoride is about 2:1.

Also provided is a nanostructure film layer comprising the at least one population of nanostructures described herein. In some embodiments, the nanostructure film layer exhibits a quantum yield of 80 to 100%. In some embodiments, the nanostructure film layer exhibits a no detectable defect emission wavelength at about 500 nm. In some embodiments, the nanostructure film layer exhibits external quantum efficiency (EQE) from about 9% to about 11% when present in a display device. In some embodiments, the nanostructure film layer exhibits a time under operation reaching 50% of initial luminescence from about 100 hours to about 300 hours when present in a display device and exposed to 500 nit. In some embodiments, the nanostructure film layer is a color conversion layer in a display device.

Also provided is a light emitting diode comprising the nanostructure film layer. In some embodiments, the light emitting diode comprises a first conductive layer, a second conductive layer, and an emitting layer between the first conductive layer and the second conductive layer, wherein the emitting layer comprises at least one population of the nanostructures.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

A ZnSe shell has benefits compared to a ZnS shell in connection with reducing interface strain between core/shell nanostructures due to different lattice constants, and reducing hole injection barrier due to to a shallow valence bond maximum (VBM). A ZnSe shell also has a benefit for providing high hole mobility but also provides less electron confinement and easy oxidation on the surface of the QDs. Improving the stability of the QDs from moisture and oxygen is essential to increase device stability.

Figure 1:
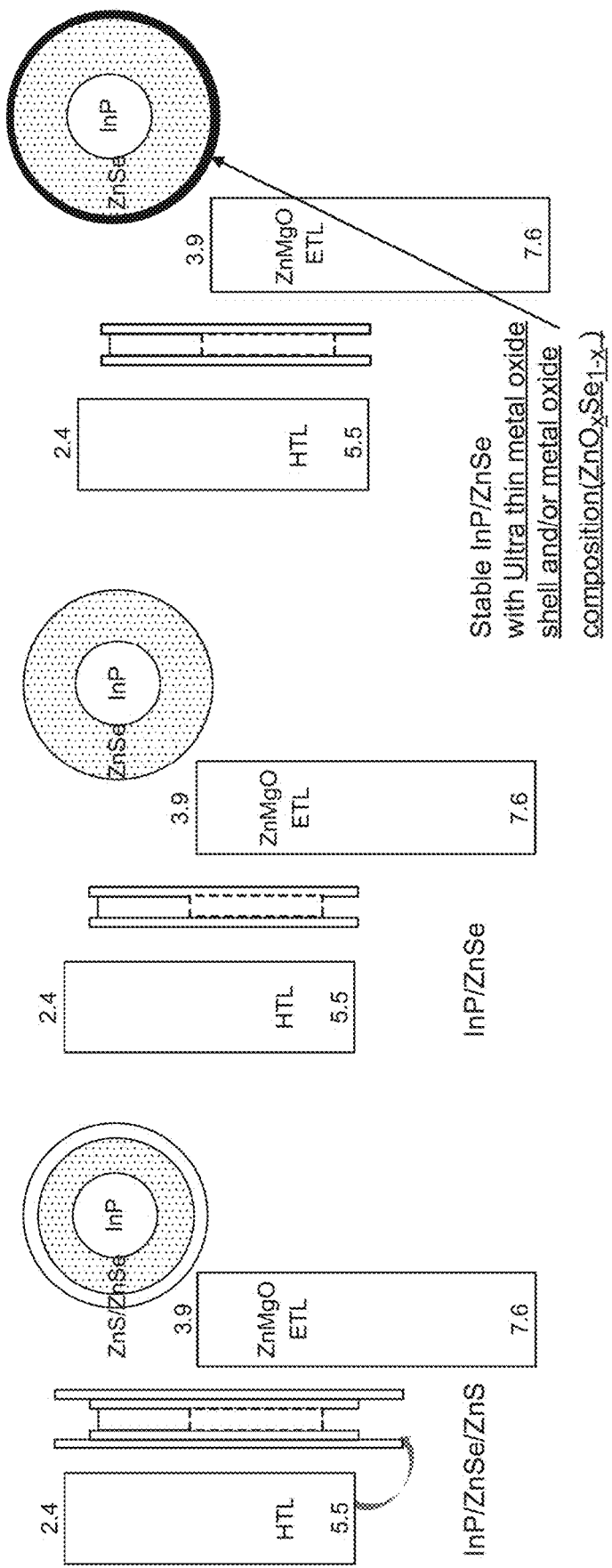
FIG. 1 depicts three electroluminescent devices comprising a hole transport layer, a quantum dot layer comprising InP/ZnSe/ZnS, InP/ZnSe, and InP/ZnSe with ultra-thin metal oxide or metal oxide composition.
Figure 2A:
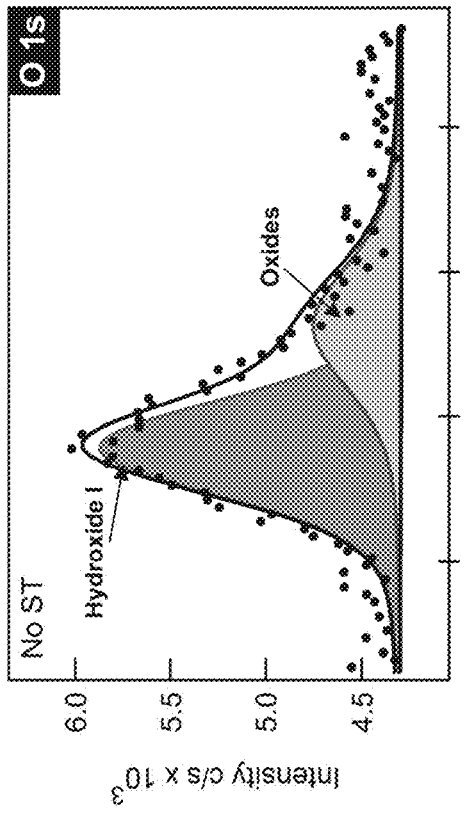
Figure 2B:
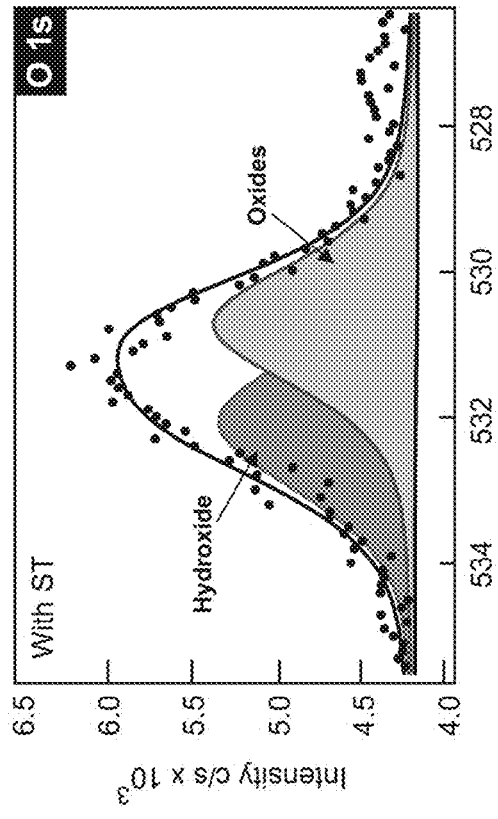
Figure 2C:
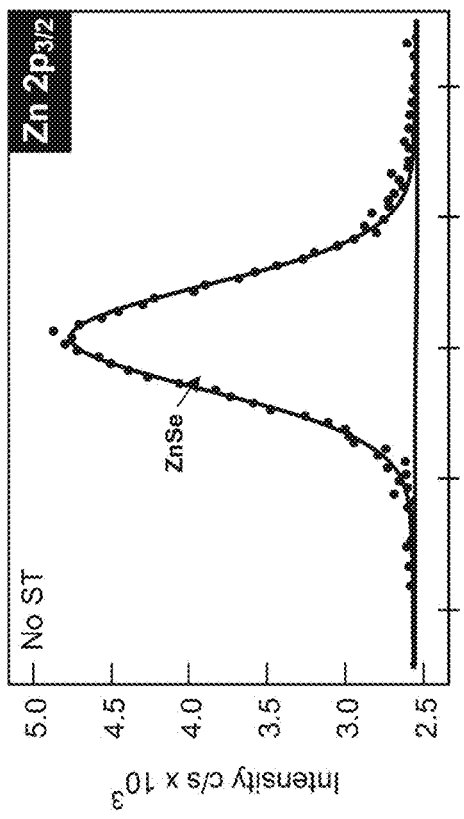
Figure 2D:
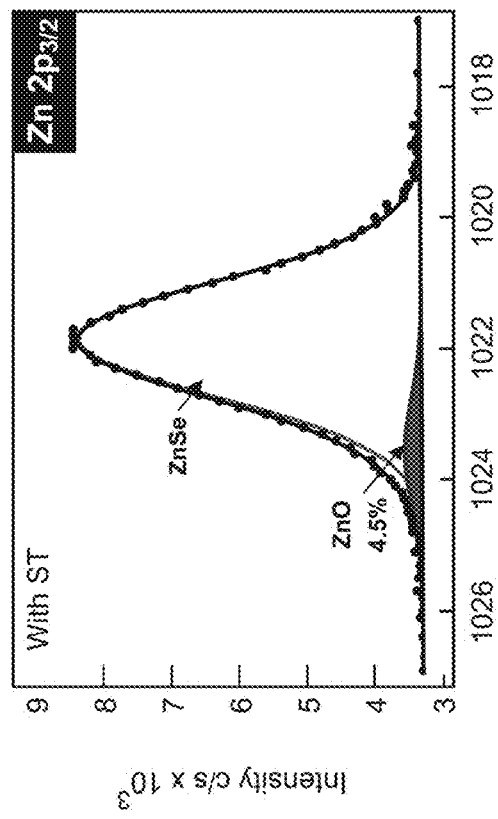

FIGS. 2A-2D depict four line graphs with binding energy of $2P_{3/2}$ level region for zinc atom ($Zn2P_{3/2}$) from X-ray photoelectron spectroscopy (XPS) with no surface treatment (ST) (FIG. 2A), 1s level region for oxygen atom ($O_1s$) of InP/ZnSe from XPS without ST (FIG. 2B), $Zn2P_{3/2}$ from XPS with ST (FIG. 2C), and O1s of surface treated InP/ZnSe QDs from XPS with ST (FIG. 2D). As shown in FIGS. 2A-2D, an ultra-thin metal oxide or a metal oxide composite $ZnO_xSe_{1-x}$ formed on the outer shells of QDs was confirmed by XPS data. ZnO and oxide signals were increased with surface treated process on InP/ZnSe QDs compared to non-treated InP/ZnSe QDs.

Figures 3A, 3B, 3C:
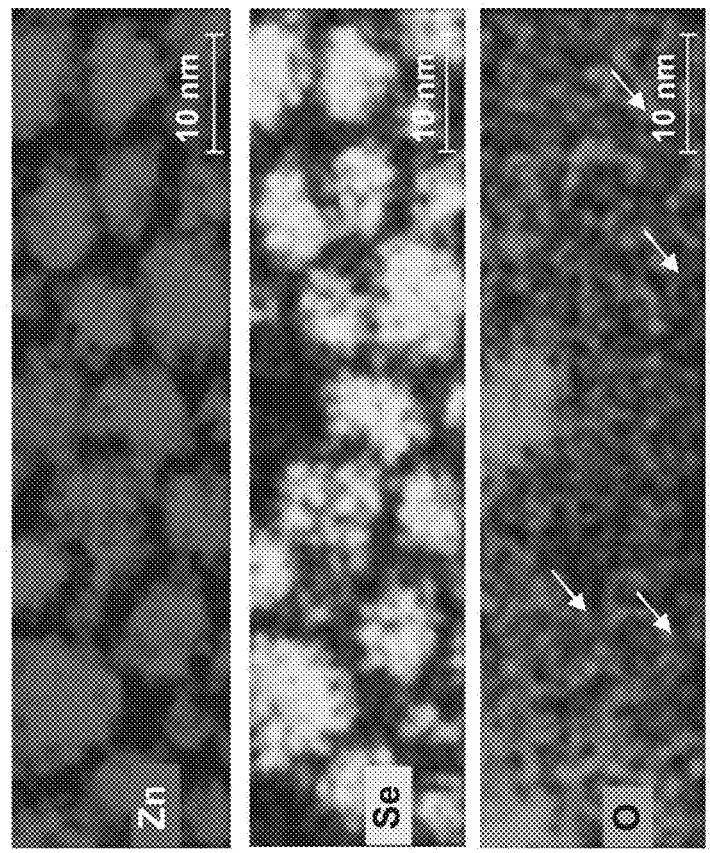

FIGS. 3A-3C are a high-resolution transmission electron microscopy (TEM) images of an elementary mapping of Zn (FIG. 3A), Se (FIG. 3B), and O (FIG. 3C) on surface treated InP/ZnSe QDs. As shown in FIG. 3C, the oxygen signal is more dominant on the surface of QDs.

Figure 4:
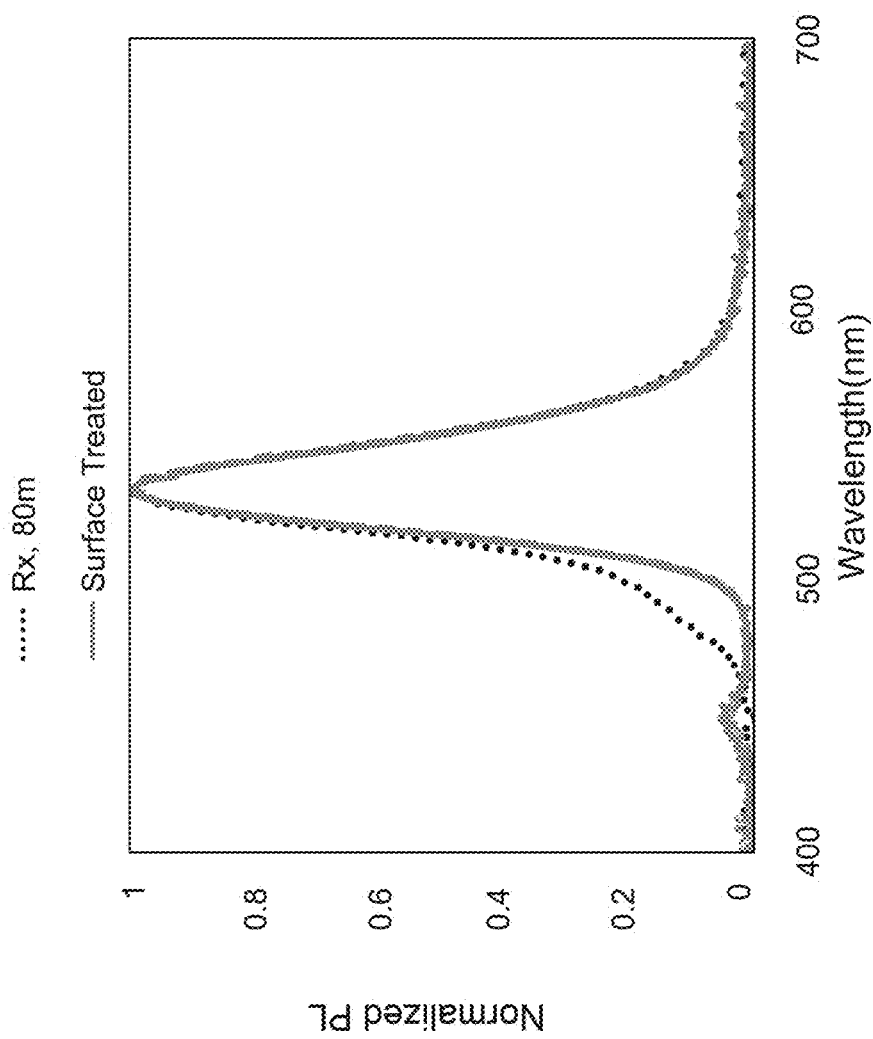

FIG. 4 is a line graph depicting a normalized phospholuminescence (PL) spectra of non-ST InP/ZnSe QDs (dotted line) and ST QDs (solid line). As shown in FIG. 4, the defect emission at short wavelength (~500 nm) was reduced by the ST process.

Figure 5A:
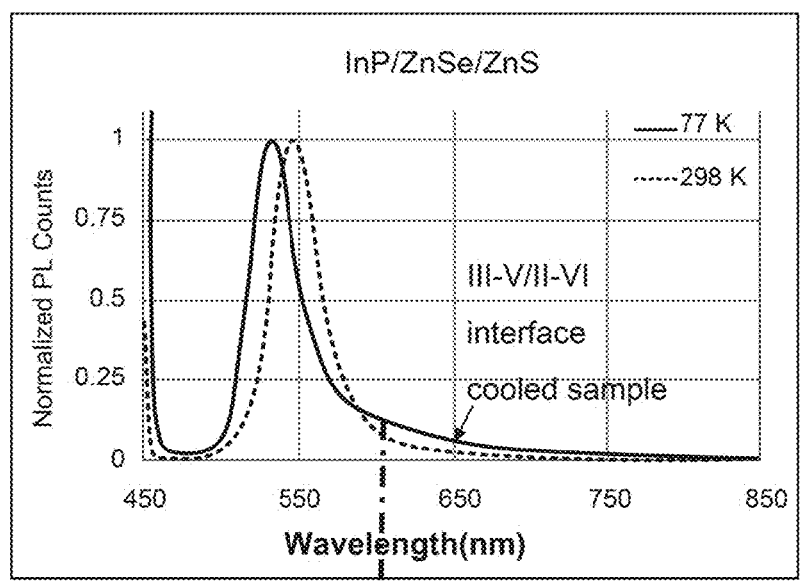
Figure 5B:
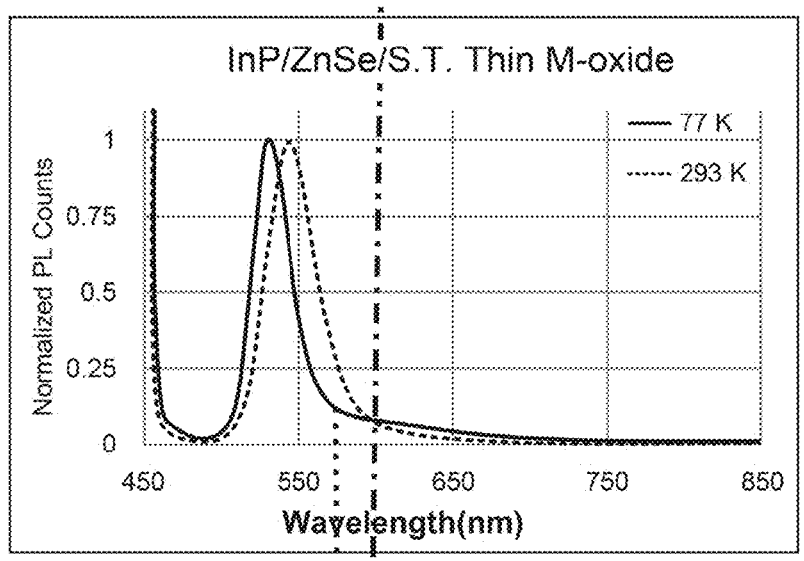
Figure 5C:
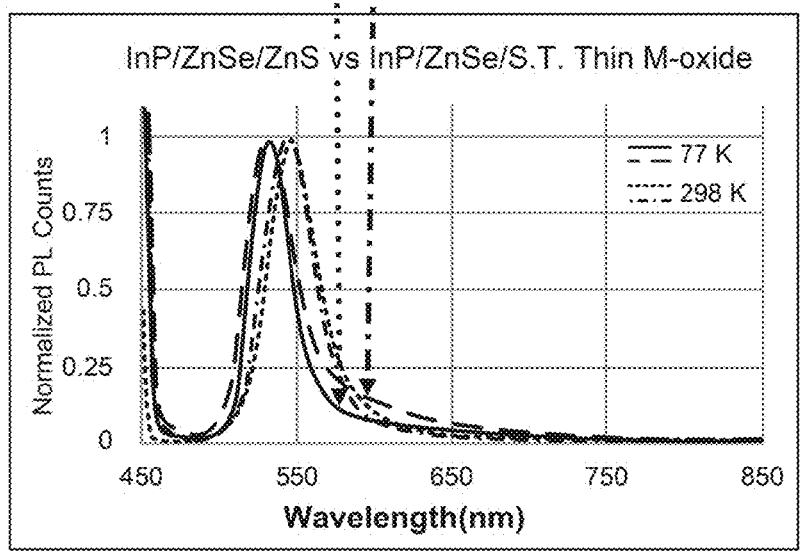

FIGS. 5A-5C depict three line graphs depicting normalized PL at 77 Kelvin (K) and 298 K for InP/ZnSe/ZnS (FIG. 5A), ST InP/ZnSe with ultra-thin metal oxide composition on outer thin shell (InP/ZnSe/S.T.; FIG. 5B), and overlay comparison of FIGS. 5A and 5B (FIG. 5C). As shown in FIGS. 5A-5C, the InP/ZnSe/ZnS quantum dots exhibit defect emission at 77 K, which comes from the III-V/II-V interface (FIG. 5A). This defect emission is reduced with the surface treated InP/ZnSe-ultra-thin metal oxide composition (FIGS. 5B and 5C).

Figure 6:
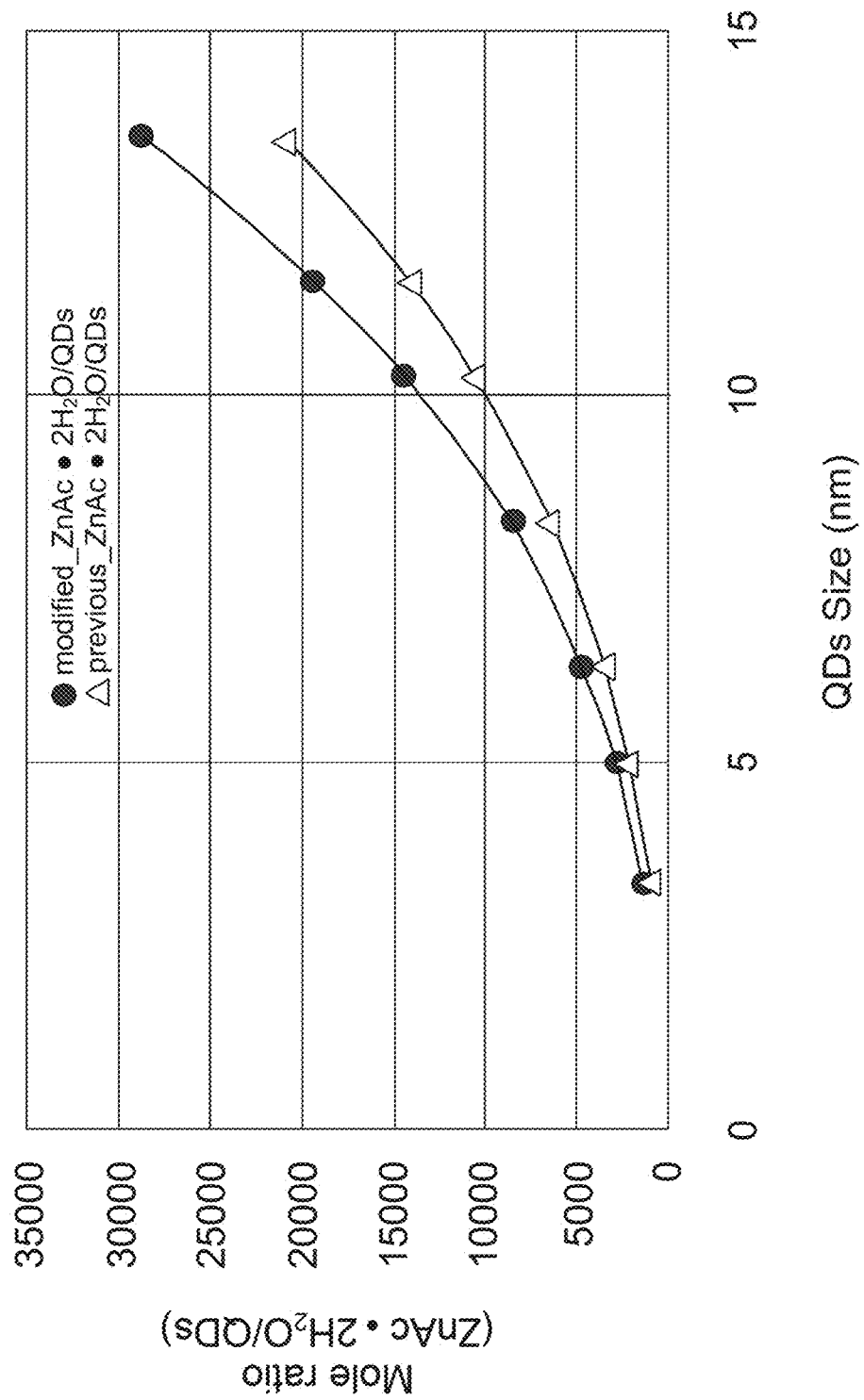

FIG. 6 depicts a line graph showing the the mole ratio (total input zinc acetate dihydrate/total number of InP/ZnSe QDs) vs. size for the previous and modified methods of making.

Figure 7:
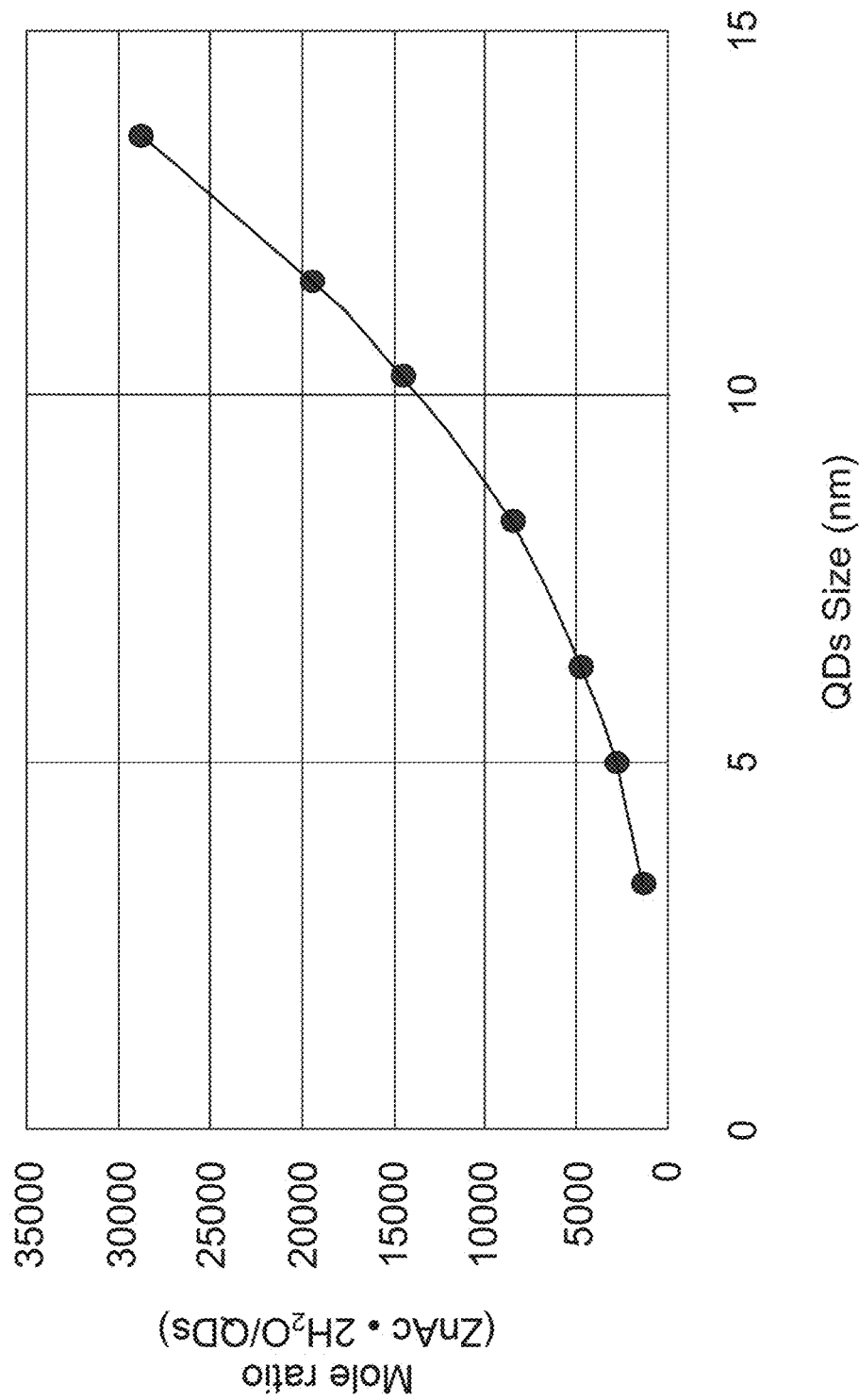

FIG. 7 depicts a line graph showing the mole ratio (total input zinc acetate dihydrate/total number of InP/ZnSe QDs) vs. size for the modified method of making QDs.

Figure 8:
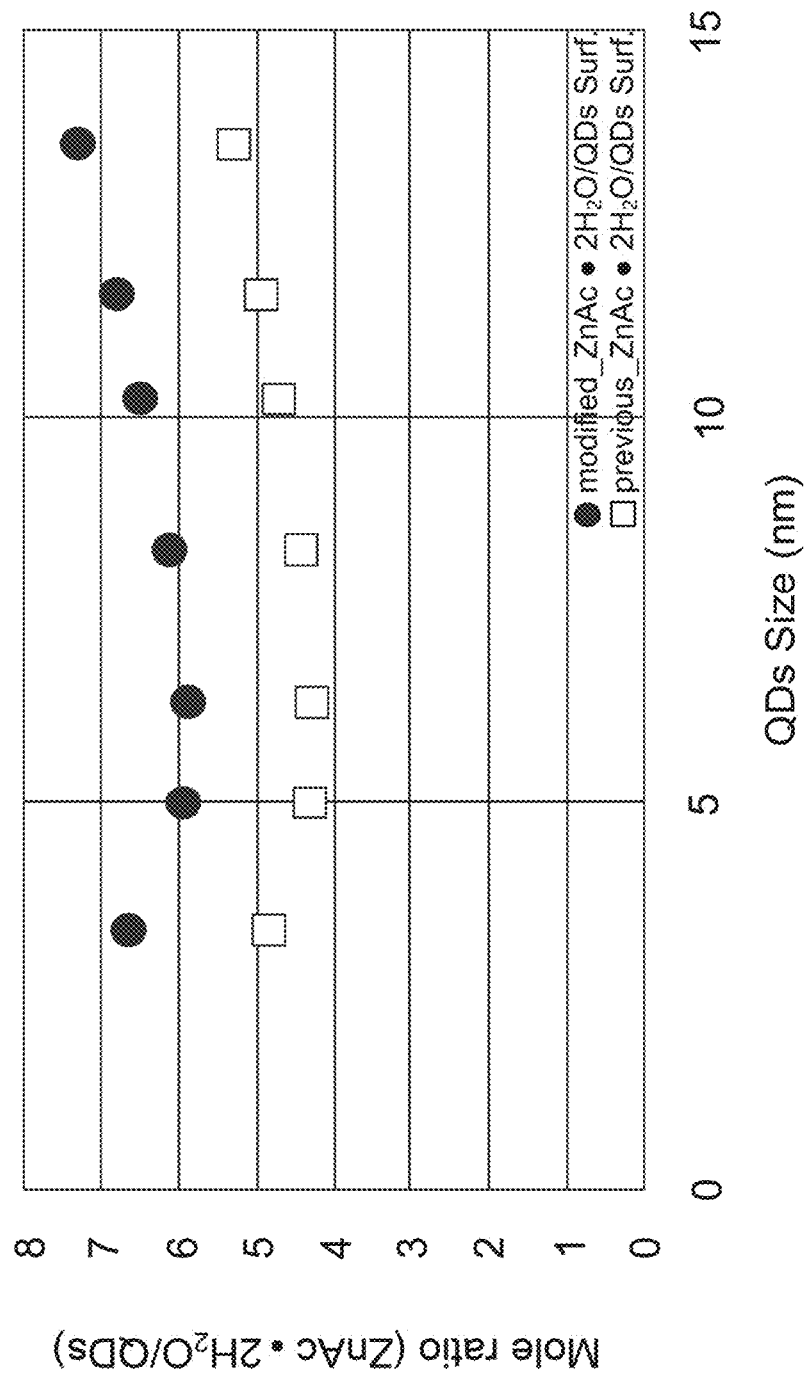

FIG. 8 depicts a line graph showing the mole ratio (total input zinc acetate dihydrate/total number of InP/ZnSe QDs surface) vs. size for the previous and modified methods of making QDs.

DETAILED DESCRIPTION OF THE INVENTION

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in practice for testing, the preferred materials and methods are described herein. Accordingly, the terminology used herein is for the purpose of describing particular embodiments only, and is not intended to be limiting.

As used in this specification and the appended claims, the singular forms "a," "an," and "the" include plural referents unless the context clearly dictates otherwise. Thus, for example, reference to "a nanostructure" includes a plurality of such nanostructures, and the like.

The term "about" as used herein indicates the value of a given quantity varies by +10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more facets of a nanostructure, e.g., through covalent, ionic, van der Waals, or other molecular interactions with the surface of the nanostructure.

"Photoluminescence quantum yield" (PLQY) is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "full width at half-maximum" (FWHM) is a measure of the size distribution of nanoparticles. The emission spectra of nanoparticles generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the peak emission wavelength.

As used herein, the term photoconversion efficiency (PCE) is a measure of the ratio of green photons emitted (forward cast) versus the total incident blue photons.

Nanostructure

In some embodiments, the present disclosure provides a nanostructure comprising a nanocrystal core and at least two thin shells, wherein the outer shell is a metal oxide that has a thickness of less than 1 nm. In some embodiments, the nanostructure exhibits an optical density at 450 nm on a per mass basis of between about 0.30 $cm^2/mg$ and about 0.50 $cm^2/mg$.

In some embodiments, the nanostructure exhibits an optical density at 450 nm on a per mass basis of between about 0.30 $cm^2/mg$ and about 0.50 $cm^2/mg$.

In some embodiments, the nanostructure is a quantum dot.

Nanostructure Composition

In some embodiments, the present disclosure provides a nanostructure composition comprising:
(a) at least one population of nanostructures comprising a nanocrystal core/shell and a metal oxide on the outer shell of the nanostructure, wherein the outer shell is less than 1 nm thick; and
(b) at least one organic resin.

In some embodiments, the nanostructure is a quantum dot.

Nanostructure Film Layer

In some embodiments, the present disclosure provides a nanostructure film layer comprising:
(a) at least one population of nanostructures comprising a nanocrystal core/shell and a metal oxide on the outer shell of the nanostructure, wherein the outer shell is less than 1 nm thick; and
(b) at least one organic resin;
wherein the nanostructure film layer exhibits a photoconversion efficiency of between about 80% and about 100%.

In some embodiments, the nanostructure is a quantum dot.

In some embodiments, the nanostructure film layer is a color conversion layer.

Nanostructure Molded Article

In some embodiments, the present disclosure provides a nanostructure molded article comprising:
(a) a first barrier layer;
(b) a second barrier layer; and
(c) a nanostructure layer between the first barrier layer and the second barrier layer, wherein the nanostructure layer comprises a population of nanostructures comprising a nanocrystal core/shell and a metal oxide on the outer shell of the nanostructure, wherein the outer shell is less than 1 nm thick; and at least one organic resin; and
wherein the nanostructure film layer exhibits a photoconversion efficiency of between about 80% and about 100%.

In some embodiments, the nanostructure is a quantum dot.

In some embodiments, the molded article is a film or substrate for a display. In some embodiments, the molded article is a liquid crystal display. In some embodiments, the molded article is a nanostructure film.

Nanostructure Core

The nanostructures for use in the present disclosure can be produced from any suitable material, suitably an inorganic material, and more suitably an inorganic conductive or semiconductive material.

In some embodiments, the nanostructure comprises a semiconductor core.

Suitable semiconductor core materials include any type of semiconductor, including Group II-VI, Group III-V, Group IV-VI, and Group IV semiconductors. Suitable semiconductor core materials include, but are not limited to, Si, Ge, Sn, Se, Te, B, C (including diamond), P, BN, BP, BAS, AlN, AlP, AlAs, AlSb, GaN, GaP, GaAs, GaSb, InN, InP, InAs, InSb, ZnO, ZnS, ZnSe, ZnTe, CdS, CdSe, CdSeZn, CdTe, HgS, HgSe, HgTe, Bes, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $Al_2CO$, and combinations thereof.

The synthesis of Group II-VI nanostructures has been described in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and in U.S. Patent Appl. Publication Nos. 2011/0262752 and 2011/0263062. In some embodiments, the core is a Group II-VI nanocrystal selected from the group consisting of ZnO, ZnSe, ZnS, ZnTe, CdO, CdSe, CdS, CdTe, HgO, HgSe, HgS, and HgTe. In some embodiments, the core is a nanocrystal selected from the group consisting of ZnSe, ZnS, CdSe, or CdS.

Although Group II-VI nanostructures such as CdSe and CdS quantum dots can exhibit desirable luminescence behavior, issues such as the toxicity of cadmium limit the applications for which such nanostructures can be used. Less toxic alternatives with favorable luminescence properties are thus highly desirable. Group III-V nanostructures in general and InP-based nanostructures in particular, offer the best known substitute for cadmium-based materials due to their compatible emission range.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, can be measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the core is a Group III-V nanostructure. In some embodiments, the core is a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core is a InP nanocrystal.

The synthesis of Group III-V nanostructures has been described in U.S. Pat. Nos. 5,505,928, 6,306,736, 6,576,291, 6,788,453, 6,821,337, 7,138,098, 7,557,028, 8,062,967, 7,645,397, and 8,282,412 and in U.S. Patent Appl. Publication No. 2015/236195. Synthesis of Group III-V nanostructures has also been described in Wells, R. L., et al., "The use of tris(trimethylsilyl) arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69:1432-1434 (1996).

Synthesis of InP-based nanostructures has been described, e.g., in Xie, R., et al., "Colloidal InP nanocrystals as efficient emitters covering blue to near-infrared," *J. Am. Chem. Soc.*

129:15432-15433 (2007); Micic, O. I., et al., "Core-shell quantum dots of lattice-matched ZnCdSe$_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and GaInP$_2$ quantum dots," *J. Phys. Chem.* 99:7754-7759 (1995); Guzelian, A. A., et al., "Synthesis of size-selected, surface-passivated InP nanocrystals," *J. Phys. Chem.* 100: 7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

In some embodiments, the core comprises InP.

The synthesis of InP cores having a lowest energy absorbance peak between about 420 nm and about 470 nm have been described in U.S. Patent Appl. Nos. 2010/276638 and 2014/001405, which are incorporated herein by reference in their entireties.

In some embodiments, the core comprises InP having an absorbance peak between 420 nm and 470 nm. In some embodiments, the core comprises InP having an absorbance peak of about 440 nm. In some embodiments, the core comprises InP having an absorbance peak of about 450 nm.

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, CuInS$_2$, CuInSe$_2$, AlN, AlP, AlAs, GaN, GaP, or GaAs.

In some embodiments, the core is purified before deposition of a shell. In some embodiments, the core is filtered to remove precipitate from the core solution.

In some embodiments, the diameter of the core is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the bandgap remains at its original energy due to a continuous energy state. However, as the confining dimension decreases and reaches a certain limit, typically in nanoscale, the energy spectrum becomes discrete. As a result, the bandgap becomes size-dependent.

Shells

In some embodiments, the nanostructures of the present disclosure comprise a core and one or more shells. In some embodiments, the one or more shells comprise a first shell and a second metal oxide shell.

In some embodiments, the nanostructures comprise 1, 2, 3, or 4 shell layers. In some embodiments, the shell has a thickness of between about 0.01 nm and about 1.5 nm, about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.01 nm and about 0.03 nm, about 0.03 nm and about 1.5 nm, about 0.03 nm and about 1.0 nm, about 0.03 nm and about 0.8 nm, about 0.03 nm and about 0.35 nm, about 0.03 nm and about 0.3 nm, about 0.03 nm and about 0.25 nm, about 0.03 nm and about 0.2 nm, about 0.03 nm and about 0.1 nm, about 0.03 nm and about 0.05 nm, about 0.05 nm and about 1.5 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 1.5 nm, about 0.1 nm and about 0.8 nm, about 0.1 nm and about 0.3 nm, about 0.1 nm and about 0.25 nm, about 0.1 nm and about 0.2 nm, about 0.2 nm and about 1.5 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 1.5 nm, about 0.25 nm and about 1.0 nm, about 0.25 nm and about 0.8 nm, about 0.25 nm and about 0.35 nm, about 0.25 nm and about 0.3 nm, about 0.3 nm and about 1.5 nm, about 0.3 nm and about 1.0 nm, about 0.3 nm and about 0.8 nm, about 0.3 nm and about 0.35 nm, about 0.35 nm and about 1.5 nm, about 0.35 and about 1.0 nm, about 0.35 nm and about 0.8 nm, about 0.8 nm and about 1.5 nm, about 0.8 nm and about 1.0 nm, or about 1.0 nm and about 1.5 nm.

First Shell

In some embodiments, a first shell deposits onto a core that comprises a mixture of Group II and VI elements. In some embodiments, a first thin shell deposits onto a core comprising a nanocrystal selected from ZnSe, ZnS, CdSe, and CdS.

In some embodiments, a first shell deposits onto a core that comprises a mixture of Group III and Group V elements. In some embodiments, a first thin shell deposits onto a core comprising a nanocrystal selected from BN, BP, BAs, BSb, AlN, AlP, AlAs, AlSb, GaN, GaP, GaAs, GaSb, InN, InP, InAs, and InSb. In some embodiments, a first shell deposits onto a core comprising InP.

In some embodiments, the first shell comprises a mixture of at least two of zinc, selenium, sulfur, tellurium, and cadmium. In some embodiments, the first shell comprises a mixture of two of zinc, selenium, sulfur, tellurium, and cadmium. In some embodiments, the first shell comprises a mixture of three of zinc, selenium, sulfur, tellurium, and cadmium. In some embodiments, the first shell comprises a mixture of: zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium and zinc; cadmium, zinc, and sulfur; cadmium, zinc, and selenium; or cadmium, zinc, sulfur, and selenium.

The thickness of the first shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

In some embodiments, the core comprises a Group II element and the first shell comprises a Group VI element. In some embodiments, the Group II element is zinc or cadmium. In some embodiments, the Group VI element is sulfur, selenium, or tellurium. In some embodiments, the molar ratio of the Group II element source and the Group VI element source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

In some embodiments, the core comprises a Group III element and the first shell comprises a Group VI element. In some embodiments, the Group III element is gallium or indium. In some embodiments, the Group VI element is sulfur, selenium, or tellurium. In some embodiments, the molar ratio of the Group III element source and Group VI element source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

In some embodiments, where the core comprises indium and the first shell comprises sulfur, the thickness of the first shell is controlled by varying the molar ratio of the sulfur source to the indium source. In some embodiments, the molar ratio of the sulfur source to the indium source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

In some embodiments, a first shell comprises more than one monolayer of shell material. The number of monolayers is an average for all the nanostructures; therefore, the number of monolayers in a first shell may be a fraction. In some embodiments, the number of monolayers in a first shell is between 0.1 and 3.0, 0.1 and 2.5, 0.1 and 2.0, 0.1 and 1.5, 0.1 and 1.0, 0.1 and 0.5, 0.1 and 0.3, 0.3 and 3.0, 0.3 and 2.5, 0.3 and 2.0, 0.3 and 1.5, 0.3 and 1.0, 0.3 and 0.5, 0.5 and 3.0, 0.5 and 2.5, 0.5 and 2.0, 0.5 and 1.5, 0.5 and 1.0, 1.0 and 3.0, 1.0 and 2.5, 1.0 and 2.0, 1.0 and 1.5, 1.5 and 3.0, 1.5 and 2.5, 1.5 and 2.0, 2.0 and 3.0, 2.0 and 2.5, or 2.5 and 3.0. In some embodiments, the first shell comprises between 0.8 and 2.5 monolayers.

The thickness of the first shell can be determined using techniques known to those of skill in the art. In some embodiments, the thickness of the shell is determined by comparing the average diameter of the nanostructure before and after the addition of the shell. In some embodiments, the average diameter of the nanostructure before and after the addition of the shell is determined by TEM.

In some embodiments, the first shell has a thickness of between about 0.01 nm and about 1.5 nm, about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.01 nm and about 0.03 nm, about 0.03 nm and about 1.5 nm, about 0.03 nm and about 1.0 nm, about 0.03 nm and about 0.8 nm, about 0.03 nm and about 0.35 nm, about 0.03 nm and about 0.3 nm, about 0.03 nm and about 0.25 nm, about 0.03 nm and about 0.2 nm, about 0.03 nm and about 0.1 nm, about 0.03 nm and about 0.05 nm, about 0.05 nm and about 1.5 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 1.5 nm, about 0.1 nm and about 0.8 nm, about 0.1 nm and about 0.3 nm, about 0.1 nm and about 0.25 nm, about 0.1 nm and about 0.2 nm, about 0.2 nm and about 1.5 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 1.5 nm, about 0.25 nm and about 1.0 nm, about 0.25 nm and about 0.8 nm, about 0.25 nm and about 0.35 nm, about 0.25 nm and about 0.3 nm, about 0.3 nm and about 1.5 nm, about 0.3 nm and about 1.0 nm, about 0.3 nm and about 0.8 nm, about 0.3 nm and about 0.35 nm, about 0.35 nm and about 1.5 nm, about 0.35 and about 1.0 nm, about 0.35 nm and about 0.8 nm, about 0.8 nm and about 1.5 nm, about 0.8 nm and about 1.0 nm, or about 1.0 nm and about 1.5 nm.

In some embodiments, the first shell comprises ZnSe shell. A ZnSe monolayer has a thickness of about 0.328 nm.

In some embodiments, where the first shell comprises ZnSe, the first shell has a thickness of between about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 0.8 nm, about 0.1 nm and about 0.3 nm, about 0.1 nm and about 0.25 nm, about 0.1 nm and about 0.2 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 0.35 nm, about 0.25 nm and about 0.3 nm, about 0.3 nm and about 1.0 nm, about 0.3 nm and about 0.8 nm, about 0.3 nm and about 0.35 nm, about 0.35 and about 1.0 nm, about 0.35 nm and about 0.8 nm, or about 0.8 nm and about 1.0 nm. In some embodiments, where the first shell comprises ZnSe, the first shell has a thickness of between about 0.25 and about 0.8 nm.

In some embodiments, the first shell comprises ZnS shell. A ZnS shell monolayer has a thickness of about 0.31 nm.

In some embodiments, where the first shell comprises ZnS, the first shell has a thickness of between about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 0.8 nm, about 0.1 nm and about 0.3 nm, about 0.1 nm and about 0.25 nm, about 0.1 nm and about 0.2 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 0.35 nm, about 0.25 nm and about 0.3 nm, about 0.3 nm and about 1.0 nm, about 0.3 nm and about 0.8 nm, about 0.3 nm and about 0.35 nm, about 0.35 and about 1.0 nm, about 0.35 nm and about 0.8 nm, or about 0.8 nm and about 1.0 nm. In some embodiments, where the first shell comprises ZnS, the first shell has a thickness of between about 0.09 and about 0.3 nm.

In some embodiments, the first shell comprises ZnS. In some embodiments, the shell precursors used to prepare a ZnS shell comprise a zinc source and a sulfur source.

In some embodiments, the first shell comprises ZnSe. In some embodiments, the shell precursors used to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trialkylthiourea, trioctylphosphine sulfide, zinc diethyldithiocarbamate, and mixtures thereof. In some embodiments, the sulfur source is an alkyl-substituted zinc dithiocarbamate. In some embodiments, the sulfur source is zinc diethylthiocarbamate. In some embodiments, the sulfur source is dodecanethiol.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, a first shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the first shell synthesis are the same. In some embodiments, the ligand(s) for the core synthesis and for the first shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of a shell are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine.

Second Shell Layer

In some embodiments, a second shell deposits onto a first shell. In some embodiments, a second shell deposits onto a first shell comprising ZnSe.

In some embodiments, the second shell comprises a mixture of at least two of zinc, selenium, sulfur, tellurium, and cadmium. In some embodiments, the second shell comprises a mixture of two of zinc, selenium, sulfur, tellurium, and cadmium. In some embodiments, the second shell comprises a mixture of three of zinc, selenium, sulfur, tellurium, and cadmium. In some embodiments, the second shell comprises a mixture of: zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium and zinc; cadmium, zinc, and sulfur; cadmium, zinc, and selenium; or cadmium, zinc, sulfur, and selenium.

The thickness of the second shell can be controlled by varying the amount of precursor provided. For a given second shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

In some embodiments, the core comprises a Group II element and the second shell comprises a Group VI element. In some embodiments, the Group II element is zinc or cadmium. In some embodiments, the Group VI element is sulfur, selenium, or tellurium. In some embodiments, the molar ratio of the Group II element source and the Group VI element source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

In some embodiments, the core comprises a Group III element and the second shell comprises a Group VI element. In some embodiments, the Group III element is gallium or indium. In some embodiments, the Group VI element is sulfur, selenium, or tellurium. In some embodiments, the molar ratio of the Group III element source and Group VI element source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

In some embodiments, where the core comprises indium and the second shell comprises sulfur, the thickness of the shell is controlled by varying the molar ratio of the sulfur source to the indium source. In some embodiments, the molar ratio of the sulfur source to the indium source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

In some embodiments, where the core comprises indium and the second shell comprises sulfur, the thickness of the shell is controlled by varying the molar ratio of the sulfur source to the indium source. In some embodiments, the molar ratio of the sulfur source to the indium source is between about 0.01:1 and about 1:1.5, about 0.01:1 and about 1:1.25, about 0.01:1 and about 1:1, about 0.01:1 and about 1:0.75, about 0.01:1 and about 1:0.5, about 0.01:1 and about 1:0.25, about 0.01:1 and about 1:0.05, about 0.05:1 and about 1:1.5, about 0.05:1 and about 1:1.25, about 0.05:1 and about 1:1, about 0.05:1 and about 1:0.75, about 0.05:1 and about 1:0.5, about 0.05:1 and about 1:0.25, about 0.25:1 and about 1:1.5, about 0.25:1 and about 1:1.25, about 0.25:1 and about 1:1, about 0.25:1 and about 1:0.75, about 0.25:1 and about 1:0.5, about 0.5:1 and about 1:1.5, about 0.5:1 and about 1:1.25, about 0.5:1 and about 1:1, about 0.5:1 and about 1:0.75, about 0.75:1 and about 1:1.5, about 0.75:1 and about 1:1.25, about 0.75:1 and about 1:1, about 1:1 and about 1:1.5, about 1:1 and about 1:1.25, or about 1:1.25 and about 1:1.5.

The thickness of the second shell can be determined using techniques known to those of skill in the art. In some embodiments, the thickness of the second shell is determined by comparing the average diameter of the nanostructure before and after the addition of the second shell. In some embodiments, the average diameter of the nanostructure before and after the addition of the second shell is determined by TEM.

In some embodiments, a second shell comprises more than one monolayer of shell material. The number of monolayers is an average for all the nanostructures; therefore, the number of monolayers in a second shell may be a fraction. In some embodiments, the number of monolayers in a second shell is between 0.1 and 3.0, 0.1 and 2.5, 0.1 and 2.0, 0.1 and 1.5, 0.1 and 1.0, 0.1 and 0.5, 0.1 and 0.3, 0.3 and 3.0, 0.3 and 2.5, 0.3 and 2.0, 0.3 and 1.5, 0.3 and 1.0, 0.3 and 0.5, 0.5 and 3.0, 0.5 and 2.5, 0.5 and 2.0, 0.5 and 1.5, 0.5 and 1.0, 1.0 and 3.0, 1.0 and 2.5, 1.0 and 2.0, 1.0 and 1.5, 1.5 and 3.0, 1.5 and 2.5, 1.5 and 2.0, 2.0 and 3.0, 2.0 and 2.5, or 2.5 and 3.0. In some embodiments, the second shell comprises between 0.3 and 1.0 monolayers.

The thickness of the second shell can be determined using techniques known to those of skill in the art. In some embodiments, the thickness of the second shell is determined by comparing the average diameter of the nanostructure before and after the addition of the shell. In some embodiments, the average diameter of the nanostructure before and after the addition of the shell is determined by TEM.

In some embodiments, the second shell has a thickness of between about 0.01 nm and about 1.5 nm, about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.01 nm and about 0.03 nm, about 0.03 nm and about 1.5 nm, about 0.03 nm and about 1.0 nm, about 0.03 nm and about 0.8 nm, about 0.03 nm and about 0.35 nm, about 0.03 nm and about 0.3 nm, about 0.03 nm and about 0.25 nm, about 0.03 nm and about 0.2 nm, about 0.03 nm and about 0.1 nm, about 0.03 nm and about 0.05 nm, about 0.05 nm and about 1.5 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 1.5 nm, about 0.1 nm and about 0.8 nm, about 0.1 nm and about 0.3 nm, about 0.1 nm and about 0.25 nm, about 0.1 nm and about 0.2 nm, about 0.2 nm and about 1.5 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 1.5 nm, about 0.25 nm and about 1.0 nm, about 0.25 nm and about 0.8 nm, about 0.25 nm and about 0.35 nm, about 0.25 nm and about 0.3 nm, about 0.3 nm and about 1.5 nm, about 0.3 nm and about 1.0 nm, about 0.3 nm and about 0.8 nm, about 0.3 nm and about 0.35 nm, about 0.35 nm and about 1.5 nm, about 0.35 and about 1.0 nm, about 0.35 nm and about 0.8 nm, about 0.8 nm and about 1.5 nm, about 0.8 nm and about 1.0 nm, or about 1.0 nm and about 1.5 nm.

In some embodiments, the second shell comprises ZnSe. A ZnSe monolayer has a thickness of about 0.328 nm.

In some embodiments, where the second shell comprises ZnSe, the second shell has a thickness of between about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 0.8 nm, about 0.1 nm and about 0.3 nm, about 0.1 nm and about 0.25 nm, about 0.1 nm and about 0.2 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 0.35 nm, about 0.25 nm and about 0.3 nm, about 0.3 nm and about 1.0 nm, about 0.3 nm and about 0.8 nm, about 0.3 nm and about 0.35 nm, about 0.35 and about 1.0 nm, about 0.35 nm and about 0.8 nm, or about 0.8 nm and about 1.0 nm. In some embodiments, where the second shell comprises ZnSe, the second shell has a thickness of between about 0.25 and about 0.8 nm.

In some embodiments, the second shell comprise ZnS shell. A ZnS shell monolayer has a thickness of about 0.31 nm.

In some embodiments, where the second shell comprises ZnS, the second shell has a thickness of between about 0.01 nm and about 1.0 nm, about 0.01 nm and about 0.8 nm, about 0.01 nm and about 0.35 nm, about 0.01 nm and about 0.3 nm, about 0.01 nm and about 0.25 nm, about 0.01 nm and about 0.2 nm, about 0.01 nm and about 0.1 nm, about 0.01 nm and about 0.05 nm, about 0.05 nm and about 1.0 nm, about 0.05 nm and about 0.8 nm, about 0.05 nm and about 0.35 nm, about 0.05 nm and about 0.3 nm, about 0.05 nm and about 0.25 nm, about 0.05 nm and about 0.2 nm, about 0.05 nm and about 0.1 nm, about 0.1 nm and about 0.35 nm, about 0.1 nm and about 1.0 nm, about 0.1 nm and about 0.8 nm, about 0.1 nm and about 0.3 nm, about 0.1 nm and about 0.25 nm, about 0.1 nm and about 0.2 nm, about 0.2 nm and about 1.0 nm, about 0.2 nm and about 0.8 nm, about 0.2 nm and about 0.35 nm, about 0.2 nm and about 0.3 nm, about 0.2 nm and about 0.25 nm, about 0.25 nm and about 0.35 nm, about 0.25 nm and about 0.3 nm, about 0.3 nm and about 1.0 nm, about 0.3 nm and about 0.8 nm, about 0.3 nm and about 0.35 nm, about 0.35 and about 1.0 nm, about 0.35 nm and about 0.8 nm, or about 0.8 nm and about 1.0 nm. In some embodiments, where the second shell comprises ZnS, the second shell has a thickness of between about 0.09 and about 0.3 nm.

In some embodiments, the second shell comprises ZnS shell. In some embodiments, the shell precursors used to prepare a ZnS shell comprise a zinc source and a sulfur source.

In some embodiments, the second shell comprises ZnSe shell. In some embodiments, the shell precursors used to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc oleate.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trialkylthiourea, trioctylphosphine sulfide, zinc diethyldithiocarbamate, and mixtures thereof. In some embodiments, the sulfur source is an alkyl-substituted zinc dithiocarbamate. In some embodiments, the sulfur source is zinc diethylthiocarbamate. In some embodiments, the sulfur source is dodecanethiol.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, a second shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the second shell synthesis are the same. In some embodiments, the ligand(s) for the core synthesis and for the second shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

Ligands suitable for the synthesis of a shell are known by those of skill in the art. In some embodiments, the ligand is a fatty acid selected from the group consisting of lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine.

Production of a Core with a First Shell and a Thin Outer Metal Oxide Shell

In some embodiments, the present disclosure is directed to a method of producing a nanostructure comprising a core and at least two thin shells, the method comprising:

(a) admixing a plurality of the nanostructure core/shell and solvent;
(b) raising the temperature to between about 180° C. and about 360° C.; and
(c) exposing the composition obtained in (b) to water in an amount that is a molar ratio of 2,000 to 10,000 water:core/shell nanostructures.

In some embodiments, the admixing in (a) is in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, trioctylamine, trioctylphosphine, and dioctyl ether. In some embodiments, the solvent is 1-octadecene.

In some embodiments, the temperature in (b)-(c) is between about 20° C. and about 250° C., about 20° C. and about 200° C., about 20° C. and about 150° C., about 20° C. and 100° C., about 20° C. and about 50° C., about 50° C. and about 250° C., about 50° C. and 200° C., about 50° C. and about 150° C., about 50° C. and about 100° C., about 100° C. and about 250° C., about 100° C. and about 200° C., about 100° C. and about 150° C., about 150° C. and about 250° C., about 150° C. and about 200° C., or about 200° C. and about 250° C. In some embodiments, the admixing in (a) is at a temperature between about 85° C. and about 200° C.

In some embodiments, the nanostructure core in (a) comprises a nanocrystal selected from BN, BP, Bas, BSb, AlN, AlP, AlAs, AlSb, GaN, GaP, GaAs, GaSb, InN, InP, InAs, and InSb. In some embodiments, the nanostructure core in (a) comprises InP.

In some embodiments, the admixing in (a) further comprises admixing at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755.

In some embodiments, the temperature of the mixture in (b) is raised, lowered, or maintained in (c) to a temperature between about 50° C. and about 350° C., about 50° C. and about 300° C., 50° C. and about 250° C., about 50° C. and 200° C., about 50° C. and about 150° C., about 50° C. and about 100° C., about 100° C. and about 350° C., about 100° C. and about 300° C., about 100° C. and about 250° C., about 100° C. and about 200° C., about 100° C. and about 150° C., about 150° C. and about 350° C., about 150° C. and about 300° C., about 150° C. and 250° C., about 150° C. and about 200° C., about 200° C. and about 350° C., about 200° C. and about 300° C., about 200° C. and about 250° C., about 250° C. and about 350° C., about 250° C. and about 300° C., or about 300° C. and about 350° C.

In some embodiments, the temperature in (c) is maintained for between about 2 minutes and about 240 minutes, about 2 minutes and about 200 minutes, about 2 minutes and about 100 minutes, about 2 minutes and about 60 minutes, about 2 minutes and about 40 minutes, about 5 minutes and about 240 minutes, about 5 minutes and about 200 minutes, about 5 minutes and about 100 minutes, about 5 minutes and about 60 minutes, about 5 minutes and about 40 minutes, about 10 minutes and about 240 minutes, about 10 minutes and about 200 minutes, about 10 minutes and about 100 minutes, about 10 minutes and about 60 minutes, about 10 minutes and about 40 minutes, about 40 minutes and about 240 minutes, about 40 minutes and about 200 minutes, about 40 minutes and about 100 minutes, about 40 minutes and about 60 minutes, about 60 minutes and about 240 minutes, about 60 minutes and about 200 minutes, about 60 minutes and about 100 minutes, about 100 minutes and about 240 minutes, about 100 minutes and about 200 minutes, or about 200 minutes and about 240 minutes.

In some embodiments, an organic solvent used to dilute the reaction mixture comprising the nanostructures is ethanol, hexane, pentane, toluene, benzene, diethylether, acetone, ethyl acetate, dichloromethane (methylene chloride), chloroform, dimethylformamide, N-methylpyrrolidinone, or combinations thereof. In some embodiments, the organic solvent is toluene.

In some embodiments, nanostructures are isolated. In some embodiments, the nanostructures are isolated by precipitation using an organic solvent. In some embodiments, the nanostructures are isolated by flocculation with ethanol.

An ultra-thin metal oxide shell on the first layer of the nanostructures is formed after the surface treatment process in (c). In some embodiments, after cooling the flask to room temperature, a metal hydrate and a fluoride salt (e.g., at about a 2:1 wt. ratio) are added to the flask, heated to 270° C., and the stirring speed increased to maximum level and dry nitrogen is introduced to remove the generated water during surface treatment. The flask is allowed to cool to 100° C., and TOP is added. The flask is carefully evacuated, then sealed with the Schlenk adapter, and transferred to the glovebox. After precipitating undissolved material at room temperature with a centrifuge, hexane and ethanol are added, and the mixture is centrifuged for purification.

In some embodiments, the metal hydrate is zinc acetate hydrate and the fluoride salt is zinc fluoride. In some embodiments, the metal hydrate is zinc acetate dihydrate and the fluoride salt is zinc fluoride.

In some embodiments, the fluoride salt is zinc fluoride, zirconum fluoride, hafnium fluoride, tungsten fluoride, gallium fluoride, lithium fluoride, sodium fluoride, or magnesium fluoride. In some embodiments, the fluoride salt is an ionic liquid. In some embodiments, the ionic liquid is an imidazolium, pyridinium, quaternary ammonium or quaternary phosphonium salt of fluoride, tetrafluoroborate or hexafluorophosphate.

Examples of quaternary ammonium cations include C1-8 tetraalkylammonium cations such as tetramethyl ammonium, tetraethyl ammonium, tetrapropyl ammonium, tetrabutyl ammonium, tetrapentyl ammonium, and tetrahexyl ammonium. Examples of quaternary phosphonium cations include C1-8 tetraalkylphosphonium cations such as tetramethyl phosphonium, tetraethyl phosphonium, tetrapropyl phosphonium, tetrabutyl phosphonium, tetrapentyl phosphonium, and tetrahexyl phosphonium.

The molar ratio of the total input zinc acetate dihydrate to the total number of QDs is from about 1000 to about 90000, wherein the QDs size ranges from about 1 nm to 20 nm. In some embodiments, the molar ratio of the total input zinc acetate dihydrate to the total number of QDs is from about 2000 to about 40000, wherein the QDs size ranges from about 1 nm to 15 nm. In some embodiments, the molar ratio of the total input zinc acetate dihydrate to the total number of QDs is from about 2500 to about 9000, wherein the QDs size ranges from about 1 nm to 8 nm. In some embodiments, the molar ratio of the total input zinc acetate dihydrate to the total number of QDs is about 2900, wherein the QDs size is about 5 nm.

The ultra-thin metal oxide shell on the outer layer of the nanostructures is less than 1 nm thick. In some embodiments, the metal oxide has a thickness of between about 0.2 nm and about 1 nm. In some embodiments, the metal oxide has a thickness of between about 0.1 nm and about 0.9 nm. In some embodiments, the metal oxide has a thickness of between about 0.1 nm and about 0.8 nm. In some embodiments, the metal oxide has a thickness of between 0.1 nm and 0.7 nm, between 0.1 nm and 0.6 nm, between 0.1 nm and 0.5 nm, between 0.1 nm and 0.4 nm, between 0.1 nm and 0.3 nm, 0.1 nm and 0.2 nm, between 0.2 nm and 0.9 nm, between 0.2 nm and 0.8 nm, between 0.2 nm and 0.7 nm, between 0.2 nm and 0.6 nm, between 0.2 nm and 0.5 nm, between 0.2 nm and 0.4 nm, between 0.2 nm and 0.3 nm, between 0.3 nm and 0.9 nm, between 0.3 nm and 0.8 nm, between 0.3 nm and 0.7 nm, between 0.3 nm and 0.6 nm, between 0.3 nm and 0.5 nm, between 0.3 nm and 0.4 nm, between 0.4 nm and 0.9 nm, between 0.4 nm and 0.8 nm, between 0.4 nm and 0.7 nm, between 0.4 nm and 0.6 nm, between 0.4 nm and 0.5 nm, between 0.5 nm and 0.9 nm, between 0.5 nm and 0.8 nm, between 0.5 nm and 0.7 nm, between 0.5 nm and 0.6 nm, between 0.6 nm and 0.9 nm, between 0.6 nm and 0.8 nm, between 0.6 nm and 0.7 nm, between 0.7 nm and 0.9 nm, between 0.7 nm and 0.8 nm, or between 0.8 nm and 0.9 nm.

In some embodiments, the metal oxide comprises CdO, ZnO, HgO, PbO, MgO, GaO, InO, TiO, AlO, RbO, LiO, RbO, CsO, ZrO, HfO, WO, NiO, VO, MoO or combinations thereof. In some embodiments, the metal oxide comprises ZnO or $ZnO_xSe_{1-x}$.

Nanostructure Properties

In some embodiments, the nanostructure is a core/shell/metal oxide shell nanostructure. In some embodiments, the nanostructure is an InP/ZnSe/ZnO nanostructure. In some embodiments, the nanostructures display a high photoluminescence quantum yield. In some embodiments, the nanostructures display a photoluminescence quantum yield of between about 50% and about 99%, about 50% and about 95%, about 50% and about 90%, about 50% and about 85%, about 50% and about 80%, about 50% and about 70%, about 50% and about 60%, 60% and about 99%, about 60% and about 95%, about 60% and about 90%, about 60% and about 85%, about 60% and about 80%, about 60% and about 70%, about 70% and about 99%, about 70% and about 95%, about 70% and about 90%, about 70% and about 85%, about 70% and about 80%, about 80% and about 99%, about 80% and about 95%, about 80% and about 90%, about 80% and about 85%, about 85% and about 99%, about 85% and about 95%, about 80% and about 85%, about 85% and about 99%, about 85% and about 90%, about 90% and about 99%, about 90% and about 95%, or about 95% and about 99%. In some embodiments, the nanostructures display a photoluminescence quantum yield of between about 93% and about 94%.

The photoluminescence spectrum of the nanostructures can cover essentially any desired portion of the spectrum. In some embodiments, the photoluminescence spectrum for the nanostructures have a emission maximum between 300 nm and 750 nm, 300 nm and 650 nm, 300 nm and 550 nm, 300 nm and 450 nm, 450 nm and 750 nm, 450 nm and 650 nm, 450 nm and 550 nm, 450 nm and 750 nm, 450 nm and 650 nm, 450 nm and 550 nm, 550 nm and 750 nm, 550 nm and 650 nm, or 650 nm and 750 nm. In some embodiments, the photoluminescence spectrum for the nanostructures has an emission maximum of between 450 nm and 550 nm.

The size distribution of the nanostructures can be relatively narrow. In some embodiments, the photoluminescence spectrum of the population of nanostructures can have a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population of nanostructures can have a full width at half maximum of between 35 nm and 50 nm.

In some embodiments, the nanostructures emit light having a peak emission wavelength (PWL) between about 400 nm and about 650 nm, about 400 nm and about 600 nm, about 400 nm and about 550 nm, about 400 nm and about 500 nm, about 400 nm and about 450 nm, about 450 nm and about 650 nm, about 450 nm and about 600 nm, about 450 nm and about 550 nm, about 450 nm and about 500 nm, about 500 nm and about 650 nm, about 500 nm and about 600 nm, about 500 nm and about 550 nm, about 550 nm and about 650 nm, about 550 nm and about 600 nm, or about 600 nm and about 650 nm. In some embodiments, the nanostructures emit light having a PWL between about 500 nm and about 550 nm.

Nanostructure Compositions

In some embodiments, the present disclosure provides a nanostructure composition comprising:
(a) at least one population of nanostructures comprising a nanocrystal core/shell and a metal oxide on the outer shell of the nanostructure, wherein the outer shell is less than 1 nm thick; and
(b) at least one organic resin.

In some embodiments, the population of nanostructures emits red, green, or blue light. In some embodiments, the respective portions of red, green, and blue light can be controlled to achieve a desired white point for the white light emitted by a display device incorporating a nanostructure film.

In some embodiments, the nanostructure composition comprises at least one population of nanostructure materials. In some embodiments, the nanostructure composition comprises a population of between 1 and 5, 1 and 4, 1 and 3, 1 and 2, 2 and 5, 2 and 4, 2 and 3, 3 and 5, 3 and 4, or 4 and 5 nanostructures. Any suitable ratio of the populations of nanostructures can be combined to create the desired nanostructure composition characteristics. In some embodiments, the nanostructure is a quantum dot.

The present disclosure provides a method of preparing a nanostructure composition, the method comprising:
(a) providing at least one population of nanostructures comprising a nanocrystal core/shell and a metal oxide on the outer shell of the nanostructure, wherein the outer shell is less than 1 nm thick; and
(b) admixing at least one organic resin with the composition of (a).

In some embodiments, the at least one population of nanostructures is admixed with at least one organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, the at least one population of nanostructures is admixed with at least one organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

In some embodiments, the at least one population of nanostructures is admixed with at least one organic resin at a temperature between about −5° C. and about 100° C., about −5° C. and about 75° C., about −5° C. and about 50° C., about −5° C. and about 23° C., about 23° C. and about 100° C., about 23° C. and about 75° C., about 23° C. and about 50° C., about 50° C. and about 100° C., about 50° C. and about 75° C., or about 75° C. and about 100° C. In some embodiments, the at least one organic resin is admixed with the at least one population of nanostructures at a temperature between about 23° C. and about 50° C.

In some embodiments, if more than one organic resin is used, the organic resins are added together and mixed. In some embodiments, a first organic resin is mixed with a second organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, a first organic resin is mixed with a second organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

Organic Resin

In some embodiments, the organic resin is a thermosetting resin or a ultraviolet (UV) curable resin. In some embodiments, the organic resin is cured by a method that facilitates roll-to-roll processing.

Thermosetting resins require curing in which they undergo an irreversible molecular cross-linking process which renders the resin infusible. In some embodiments, the thermosetting resin is an epoxy resin, a phenolic resin, a vinyl resin, a melamine resin, a urea resin, an unsaturated polyester resin, a polyurethane resin, an allyl resin, an acrylic resin, a polyamide resin, a polyamide-imide resin, a phenolamine condensation polymerization resin, a urea melamine condensation polymerization resin, or combinations thereof.

In some embodiments, the thermosetting resin is an epoxy resin. Epoxy resins are easily cured without evolution of volatiles or by-products by a wide range of chemicals. Epoxy resins are also compatible with most substrates and tend to wet surfaces easily. See Boyle, M. A., et al., "Epoxy Resins," Composites, Vol. 21, ASM Handbook, pages 78-89 (2001).

In some embodiments, the organic resin is a silicone thermosetting resin. In some embodiments, the silicone thermosetting resin is OE6630A or OE6630B (Dow Corning Corporation, Auburn, MI).

In some embodiments, a thermal initiator is used. In some embodiments, the thermal initiator is AIBN [2,2'-Azobis(2-methylpropionitrile)] or benzoyl peroxide.

UV curable resins are polymers that cure and quickly harden when exposed to a specific light wavelength. In some embodiments, the UV curable resin is a resin having as a functional group a radical-polymerization group such as a (meth) acryloxy group, a vinyloxy group, a styryl group, or a vinyl group; a cation-polymerizable group such as an epoxy group, a thioepoxy group, a vinyloxy group, or an oxetanyl group. In some embodiments, the UV curable resin is a polyester resin, a polyether resin, a (meth)acryli c resin, an epoxy resin, a urethane resin, an alkyd resin, a spiroacetal resin, a polybutadiene resin, or a polythiolpolyene resin.

In some embodiments, the UV curable resin is selected from the group consisting of urethane acrylate, allyloxylated cyclohexyl diacrylate, bis(acryloxy ethyl) hydroxyl isocyanurate, bis (acryloxy neopentylglycol) adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentaacrylate, di(trimethylolpropane) tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyethyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl) isocyanurate, phosphoric acid triacrylate, phosphoric acid diacrylate, acrylic acid propargyl ester, vinyl terminated polydimethylsiloxane, vinyl terminated diphenylsiloxane-dimethylsiloxane copolymer, vinyl terminated polyphenylmethylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane, monoallyl-mono trimethylsiloxy terminated polyethylene oxide, and combinations thereof.

In some embodiments, the UV curable resin is a mercapto-functional compound that can be cross-linked with an isocyanate, an epoxy, or an unsaturated compound under UV curing conditions. In some embodiments, the polythiol is pentaerythritol tetra(3-mercapto-propionate) (PETMP); trimethylol-propane tri(3-mercapto-propionate) (TMPMP); glycol di(3-mercapto-propionate) (GDMP); tris[25-(3-mercapto-propionyloxy)ethyl] isocyanurate (TEMPIC); di-pentaerythritol hexa (3-mercapto-propionate) (Di-PETMP); ethoxylated trimethylolpropane tri(3-mercapto-propionate) (ETTMP 1300 and ETTMP 700); polycaprolactone tetra(3-mercapto-propionate) (PCL4MP 1350); pentaerythritol tetramercaptoacetate (PETMA); trimethylol-propane trimercaptoacetate (TMPMA); or glycol dimercaptoacetate (GDMA). These compounds are sold under the trade name THIOCURE® by Bruno Bock, Marschacht, Germany.

In some embodiments, the UV curable resin is a polythiol. In some embodiments, the UV curable resin is a polythiol selected from the group consisting of ethylene glycol bis (thioglycolate), ethylene glycol bis(3-mercaptopropionate), trimethylol propane tris (thioglycolate), trimethylol propane tris(3-mercaptopropionate), pentaerythritol tetrakis (thioglycolate), pentaerythritol tetrakis(3-mercaptopropionate) (PETMP), and combinations thereof. In some embodiments, the UV curable resin is PETMP.

In some embodiments, the UV curable resin is a thiol-ene formulation comprising a polythiol and 1,3,5-Triallyl-1,3,5-triazine-2,4,6 (1H,3H,5H)-trione (TTT). In some embodiments, the UV curable resin is a thiol-ene formulation comprising PETMP and TTT.

In some embodiments, the UV curable resin further comprises a photoinitiator. A photoinitiator initiates the crosslinking and/or curing reaction of the photosensitive material during exposure to light. In some embodiments, the photoinitiator is acetophenone-based, benzoin-based, or thioxathenone-based.

In some embodiments, the photoinitiator is a vinyl acrylate-based resin. In some embodiments, the photoinitiator is MINS-311RM (Minuta Technology Co., Ltd, Korea).

In some embodiments, the photoinitiator is IRGACURE® 127, IRGACURE® 184, 184D, IRGACURE® 2022, IRGACURE® 2100, IRGACURE® 250, IRGACURE® IRGACURE® 270, IRGACURE® 2959, IRGACURE® 369, IRGACURE® 369 EG, IRGACURE® 379, IRGACURE® 500, IRGACURE® 651, IRGACURE® 754, IRGACURE® 784, IRGACURE® 819, IRGACURE® 819Dw, IRGACURE® 907, IRGACURE® 907 FF, IRGACURE® Oxe01, IRGACURE® TPO-L, IRGACURE® 1173, IRGACURE® 1173D, IRGACURE® 4265, IRGACURE® BP, or IRGACURE® MBF (BASF Corporation, Wyandotte, MI). In some embodiments, the photoinitiator is TPO (2,4,6-trimethylbenzoyl-diphenyl-phosphine oxide) or MBF (methyl benzoylformate).

In some embodiments, the weight percentage of the at least one organic resin in the nanostructure composition is between about 5% and about 99%, about 5% and about 95%, about 5% and about 90%, about 5% and about 80%, about 5% and about 70%, about 5% and about 60%, about 5% and about 50%, about 5% and about 40%, about 5% and about 30%, about 5% and about 20%, about 5% and about 10%, about 10% and about 99%, about 10% and about 95%, about 10% and about 90%, about 10% and about 80%, about 10% and about 70%, about 10% and about 60%, about 10% and about 50%, about 10% and about 40%, about 10% and about 30%, about 10% and about 20%, about 20% and about 99%, about 20% and about 95%, about 20% and about 90%, about 20% and about 80%, about 20% and about 70%, about 20% and about 60%, about 20% and about 50%, about 20% and about 40%, about 20% and about 30%, about 30% and about 99%, about 30% and about 95%, about 30% and about 90%, about 30% and about 80%, about 30% and about 70%, about 30% and about 60%, about 30% and about 50%, about 30% and about 40%, about 40% and about 99%, about 40% and about 95%, about 40% and about 90%, about 40% and about 80%, about 40% and about 70%, about 40% and about 60%, about 40% and about 50%, about 50% and about 99%, about 50% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 99%, about 80% and about 95%, about 80% and about 90%, about 90% and about 99%, about 90% and about 95%, or about 95% and about 99%.

Nanostructure Layer

The nanostructures used in the present invention can be embedded in a polymeric matrix using any suitable method. As used herein, the term "embedded" is used to indicate that the quantum dot population is enclosed or encased with the polymer that makes up the majority of the component of the matrix. The some embodiments, the at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, the present disclosure provides a nanostructure film layer comprising:
  (a) at least one population of nanostructures, the nanostructures comprising a nanocrystal core/shell and a metal oxide on the outer shell of the nanostructure, wherein the outer shell is less than 1 nm thick; and
  (b) at least one organic resin;
wherein the nanostructure film layer exhibits a photoconversion efficiency of between about 25% and about 40%.

In some embodiments, the nanostructure film layer is a color conversion layer.

The nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. Preferably, the quantum dot composition is cured after deposition. Suitable curing methods include photo-curing, such as UV curing, and thermal curing. Traditional laminate film processing methods, tape-coating methods, and/or roll-to-roll fabrication methods can be employed in forming the quantum dot films of the present invention. The quantum dot composition can be coated directly onto the desired layer of a substrate. Alternatively, the quantum dot composition can be formed into a solid layer as an independent element and subsequently applied to the substrate. In some embodiments, the nanostructure composition can be deposited on one or more barrier layers.

Spin Coating

In some embodiments, the nanostructure composition is deposited onto a substrate using spin coating. In spin coating a small amount of material is typically deposited onto the center of a substrate loaded onto a machine with a spinner and is secured by a vacuum. A high speed of rotation is applied on the substrate through the spinner which causes centripetal force to spread the material from the center to the edge of the substrate. While most of the material would be spun off, a certain amount remains on the substrate, forming a thin film of material on the surface as the rotation continues. The final thickness of the film is determined by the nature of the deposited material and the substrate in addition to the parameters chosen for the spin process such as spin speed, acceleration, and spin time. For typical films, a spin speed of 1500 to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to the wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," *ESC Transactions* 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the quantum dot composition is water, organic solvents, inorganic solvents, halogenated organic solvents, or mixtures thereof. Illustrative solvents include, but are not limited to, water, $D_2O$, acetone, ethanol, dioxane, ethyl acetate, methyl ethyl ketone, isopropanol, anisole, γ-butyrolactone, dimethylformamide, N-methylpyrroldinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the compositions are thermally cured to form the nanostructure layer. In some embodiments, the compositions are cured using UV light. In some embodiments, the quantum dot composition is coated directly onto a barrier layer of a quantum dot film, and an additional barrier layer is subsequently deposited upon the quantum dot layer to create the quantum dot film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a quantum dot layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum film white point), as well as the nanostructure film thickness and other characteristics. Additionally, these embodiments will allow for periodic testing of the quantum dot film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Nanostructure Film Features and Embodiments

In some embodiments, the nanostructure films of the present invention are used to form display devices. As used herein, a display device refers to any system with a lighting display. Such devices include, but are not limited to, devices encompassing a liquid crystal display (LCD), televisions, computers, mobile phones, smart phones, personal digital assistants (PDAs), gaming devices, electronic reading devices, digital cameras, and the like.

In some embodiments, the optical films containing nanostructure compositions are substantially free of cadmium. As used herein, the term "substantially free of cadmium" is intended that the nanostructure compositions contain less than 100 ppm by weight of cadmium. The RoHS compliance definition requires that there must be no more than 0.01% (100 ppm) by weight of cadmium in the raw homogeneous precursor materials. The cadmium concentration can be measured by inductively coupled plasma mass spectroscopy (ICP-MS) analysis, and are on the parts per billion (ppb) level. In some embodiments, optical films that are "substantially free of cadmium" contain 10 to 90 ppm cadmium. In other embodiment, optical films that are substantially free of cadmium contain less than about 50 ppm, less than about 20 ppm, less than about 10 ppm, or less than about 1 ppm of cadmium.

Nanostructure Molded Article

In some embodiments, the present disclosure provides a nanostructure molded article comprising:
(a) a first barrier layer;
(b) a second barrier layer; and
(c) a nanostructure layer between the first barrier layer and the second barrier layer, wherein the nanostructure layer comprises a population of nanostructures comprising a nanostructure core/shell and a metal oxide on the outer shell of the nanostructure, wherein the outer shell is less than 1 nm thick; and
wherein the nanostructure molded article exhibits a photoconversion efficiency of between about 80% and about 100%.

Barrier Layers

In some embodiments, the quantum dot molded article comprises one or more barrier layers disposed on either one or both sides of the quantum dot layer. Suitable barrier layers protect the quantum dot layer and the quantum dot molded article from environmental conditions such as high temperatures, oxygen, and moisture. Suitable barrier materials include non-yellowing, transparent optical materials which are hydrophobic, chemically and mechanically compatible with the quantum dot molded article, exhibit photo- and chemical-stability, and can withstand high temperatures. Preferably, the one or more barrier layers are index-matched to the quantum dot molded article. In preferred embodiments, the matrix material of the quantum dot molded article and the one or more adjacent barrier layers are index-matched to have similar refractive indices, such that most of the light transmitting through the barrier layer toward the quantum dot molded article is transmitted from the barrier layer into the quantum dot layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In preferred embodiments, the one or more barrier layers will be compatible with laminate film processing techniques, whereby the quantum dot layer is disposed on at least a first barrier layer, and at least a second barrier layer is disposed on the quantum dot layer on a side opposite the quantum dot layer to form the quantum dot molded article according to one embodiment of the present invention. Suitable barrier materials include any suitable barrier materials known in the art. For example, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the quantum dot molded article comprises at least 2 layers comprising different materials or compositions, such that the multi-layered barrier eliminates or reduces pinhole defect alignment in the barrier layer, providing an effective barrier to oxygen and moisture penetration into the quantum dot layer. The quantum dot layer can include any suitable material or combination of materials and any suitable number of barrier layers on either or both sides of the quantum dot layer. The materials, thickness, and number of barrier layers will depend on the particular application, and will suitably be chosen to maximize barrier protection and brightness of the quantum dot layer while minimizing thickness of the quantum dot molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the quantum dots comprise heavy metals or other toxic materials, which guidelines may require more or thicker barrier layers. Additional considerations for the barriers include cost, availability, and mechanical strength.

In some embodiments, the quantum dot film comprises two or more barrier layers adjacent each side of the quantum dot layer, for example, two or three layers on each side or two barrier layers on each side of the quantum dot layer. In some embodiments, each barrier layer comprises a thin glass sheet, e.g., glass sheets having a thickness of about 100 µm, 100 µm or less, or 50 µm or less.

Each barrier layer of the quantum dot film of the present invention can have any suitable thickness, which will depend on the particular requirements and characteristics of the lighting device and application, as well as the individual film components such as the barrier layers and the quantum dot layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Nanostructure Molded Article Properties

In some embodiments, the nanostructure is a core/shell/metal oxide shell nanostructure. In some embodiments, the nanostructure is an InP/ZnSe/ZnO nanostructure.

In some embodiments, the nanostructure molded article is a nanostructure film.

The photoluminescence spectrum of the nanostructure molded article can cover essentially any desired portion of the spectrum. In some embodiments, the photoluminescence spectrum for the nanostructure molded article has a emission maximum between 300 nm and 750 nm, 300 nm and 650 nm, 300 nm and 550 nm, 300 nm and 450 nm, 450 nm and 750 nm, 450 nm and 650 nm, 450 nm and 550 nm, 450 nm and 750 nm, 450 nm and 650 nm, 450 nm and 550 nm, 550 nm and 750 nm, 550 nm and 650 nm, or 650 nm and 750 nm. In some embodiments, the photoluminescence spectrum for the nanostructure molded article has an emission maximum of between 450 nm and 550 nm.

The size distribution of the nanostructure molded article can be relatively narrow. In some embodiments, the photoluminescence spectrum of the nanostructure molded article has a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population of nanostructures can have a full width at half maximum of between 33 nm and 34 nm.

In some embodiments, the nanostructure molded article emits light having a peak emission wavelength (PWL) between about 400 nm and about 650 nm, about 400 nm and about 600 nm, about 400 nm and about 550 nm, about 400 nm and about 500 nm, about 400 nm and about 450 nm, about 450 nm and about 650 nm, about 450 nm and about 600 nm, about 450 nm and about 550 nm, about 450 nm and about 500 nm, about 500 nm and about 650 nm, about 500 nm and about 600 nm, about 500 nm and about 550 nm, about 550 nm and about 650 nm, about 550 nm and about 600 nm, or about 600 nm and about 650 nm. In some embodiments, the nanostructures emit light having a PWL between about 500 nm and about 550 nm.

In some embodiments, the nanostructure molded article displays a high photoconversion efficiency (PCE). In some embodiments, the nanostructure molded article display a PCE of between about 25% and about 40%, about 25% and about 35%, about 25% and about 30%, about 25% and about 28%, about 28% and about 40%, about 28% and about 35%, about 28% and about 30%, about 30% and about 40%, about 30% and about 35%, or about 35% and about 40%. In some embodiments, the nanostructure molded articles display a PCE of between about 28% and about 30%.

In some embodiments, the nanostructure molded article displays an optical density at 450 nm of between about 0.80 and about 0.99, about 0.80 and about 0.95, about 0.80 and about 0.90, about 0.80 and about 0.85, about 0.85 and about 0.99, about 0.85 and about 0.95, about 0.85 and about 0.90, about 0.90 and about 0.99, about 0.90 and about 0.95, or about 0.95 and about 0.99. In some embodiments, the nanostructure molded article displays an optical density at 450 nm of between about 0.80 and about 0.95. In some embodiments, the nanostructure molded article displays an optical density at 450 nm of between about 0.85 and about 0.95.

Display Device with Nanostructure Color Conversion Layer

In some embodiments, the present invention provides a display device comprising:

(a) a display panel to emit a first light;
(b) a backlight unit configured to provide the first light to the display panel; and
(c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 µm and about 10 µm, about 3 µm and about 8 µm, about 3 µm and about 6 µm, about 6 µm and about 10 µm, about 6 µm and about 8 µm, or about 8 µm and about 10 µm. In some embodiments, the color conversion layer has a thickness between about 3 µm and about 10 µm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

Light Emitting Diodes

In some embodiments, the nanostructure film layer is in a light emitting diode of display device. In one embodiment, the light emitting diode comprises a first conductive layer, a second conductive layer, and an emitting layer between the first conductive layer and the second conductive layer, wherein the emitting layer comprises at least one population of the nanostructures.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons. In some embodiments, the hole transport layer comprises poly[(9,9-dioctylfluorenyl-2,7-diyl)-co-(4,4'-(N-(4-sec-butylphenyl)diphenylamine)] (TFB).

Such devices may be made as follows.

Materials Needed:
  ITO-coated glass substrate.
  HIL (hole injection layer): PEDOT-PSS.
  Hole transport layer: TFB
  QD EML:
  Nanostructures, 40 mg/mL in anhydrous octane
  ETL: ZnMgO ("15% at" Mg). 12 mg/mL in Ethanol
  Cathode: 150 nm Aluminum (4 shot pellets)

Process for Device
  Substrate cleaning: Substrates cleaned by ultrasonicating in a DI Water bath for 30 minutes, followed by ultrasonicating in 1:1:1 IPA: Acetone: Ethanol bath for 30 minutes.
  Substrates are blown dry with nitrogen and stored in air environment in clean aluminum foil wrap contained in a closed metal box.
  Substrate preparation: UV-Ozone treat substrates for 20 minutes. Do not use added heat.
  Spincoating HIL PEDOT: PSS: Conditions: Spin coating, bake=200° C. for 15 min.
  Thickness on underlying layer: 40 nm.
  Spincoating HTL: Conditions: 4000 rpm bake=200° C. for 1 hr. (Start spincoater
  Thickness on underlying layer: 25 nm.
  Spincoating QD EML (40 mg/ml): 40 mg/mL QD solution in octane. Thickness on underlying layer: ~30 nm.
  Spincoating ETL (ZnMgO): no bake. Expected Thickness on underlying layer: 40 nm.
  Evaporating Al: Evaporate 150 nm Al @2-2.5 A/s
  Encapsulate and test the devices.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of quantum dot layers, allows printing pixels of a display, and eliminates photopatterning. Thus, inkjet printing is very attractive for industrial application—particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional quantum dots generally cannot be dissolved in these solvents. However, the increased hydrophilicity of the quantum dots comprising poly(alkylene oxide) ligands allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures comprising poly(alkylene oxide) ligands comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 10%, about 1% and about 5%, about 1% and about 2%, about 2% and about 20%, about 2% and about 15%, about 2% and about 10%, about 2% and about 5%, about 5% and about 20%, about 5% and about 15%, about 5% and about 10%, about 10% and about 20%, about 10% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, or a battery. In some embodiments, the inkjet composition comprising a nanostructure composition described herein is used in the formulation of a light-emitting device.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

First Synthesis of InP/ZnSe Green QDs 28.2895 grams of zinc oleate and 8.0631 grams of lauric acid were weighed out, and added in a three-neck round bottom flask. 79.65 mL of 1-octadecene (ODE) was added to the mixture with a stir bar. The flask was outfit with a rubber septum, a thermocouple adapter with a thermocouple, and a Schlenk adapter, and connected to the Schlenk line. After carefully degassing the solution at room temperature with vigorous stirring, the flask was placed under nitrogen flow from the Schlenk line. Then the flask was lowered into a heating mantle and heated to about 90° C. under nitrogen flow. After obtaining a clear, colorless solution, the flask was carefully evacuated with vigorous stirring for a couple of minutes. The flask was placed under nitrogen flow and heated up to 110° C. As the solution reached to 110° C., 150 mg of zinc chloride, weighed out into a vial from a glovebox, was added. Once the solution temperature was stabilized at 110° C., 4.13 mL of InP cores was added and allowed the QDs to etch in the solution for 10 min. After 10 min, the rubber septum was removed and 150 mg of $ZnBr_2$ and 300 mg of $GaCl_3$, weighed out in a glovebox, were quickly added and the rubber septum was quickly returned. To this solution, 1.73 mL of 1.92 M TOPSe in trioctylphosphine (TOP) was injected through the rubber septum, and the mixture was heated up to 270° C. As soon as the temperature reached to 270° C., 325.94 mg Se powder with 20 mL ODE was delivered by using the syringe pump. Upon addition, the temperature was raised to 310° C., and held at that temperature for 20 min. After 20 min, the heat was turned off from the temperature controller, the heating mantle underneath the flask was removed, and allowed the flask to cool.

Example 2

Surface Treatment Process for Ultra-Thin or Composite Metal Oxide on InP/ZnSe

After cooling the flask of Example 1 to room temperature, the rubber septum was quickly removed, 4.36 grams of zinc acetate dihydrate and 3 grams of zinc fluoride were added to the flask, and the rubber spectrum was quickly replaced. The flask was placed back into the heating mantle and heated to 270° C., and held at that temperature for 2 h. After 2 h, the flask was allowed to cool to 100° C. Once the flask was cooled to about 100° C., 34 mL of TOP was added from syringes prepared in the glovebox. The flask was carefully evacuated, then sealed with the Schlenk adapter, and transferred to the glovebox along with a couple of Teflon bottles. Undissolved material was precipitated at room temperature with a centrifuge at 5000 rpm for 30 min. The clear crude solution was carried forward for purification. Hexane and ethanol were added, and the mixture was centrifuged at 4000 rpm for 15 min for purification (repeated 3 times).

Example 3

Modified Synthesis of InP/ZnSe Green QDs 28.2895 grams of zinc oleate and 8.0631 grams of lauric acid were weighed out, and added in a three-neck round bottom flask. 79.65 mL of ODE was added to the mixture with a stir bar. The flask was outfitted with a rubber septum, a thermocouple adapter with a thermocouple, and a Schlenk adapter and connected to the Schlenk line. After carefully degassing the solution at room temperature with vigorous stirring, the flask was placed under nitrogen flow from the Schlenk line. Then the flask was lowered into a heating mantle and heated to about 90° C. under nitrogen flow. After obtaining a clear, colorless solution, the flask was carefully evacuated with vigorous stirring for a couple of minutes. The flask was placed under nitrogen flow, and heated up to 110° C. As the solution reached to 110° C., 150 mg of zinc chloride, weighed out into a vial from a glovebox, was added. Once the solution temperature was stabilized at 110° C., 4.13 mL of InP cores (from Example 2) was added, and the QDs. the rubber septum was removed and 150 mg of $ZnBr_2$ and 300 mg of $GaCl_3$, weighed out in a glovebox, were quickly added, and the rubber septum was quickly returned. To this solution, 1.73 mL of 1.92 M TOPSe in trioctylphosphine (TOP) was injected through the rubber septum, and the mixture was heated up to 270° C. As soon as the temperature reached to 270° C., 41 mL of 0.1 M Se-ODE was delivered by a syringe pump. Upon addition, the temperature was raised to 310° C., and held at that temperature for 90 min. After 90 min, the heat was turned off from the temperature controller, the heating mantle underneath the flask was removed, and the flask allowed to cool.

Example 4

Modified Surface Treatment Process for Ultra-Thin or Composite Metal Oxide on InP/ZnSe After cooling the flask of Example 3 to room temperature, the rubber septum was quickly removed, and 6 grams of zinc acetate dihydrate and 3 grams of zinc fluoride (2:1 ratio) were added to the flask. The rubber septum was then quickly replaced. The flask was placed back into the heating mantle and heated to 270° C. and held at that temperature for 2 h. The stirring speed was increased to maximum level and dry nitrogen was introduced through the septum via a needle, and the gas flow rate was held at 1~5 sccm to remove the generated water during surface treatment. After 2 h, the flask was allowed to cool to 100° C. Once the flask was cooled to about 100° C., 34 mL of TOP was added with a syringe prepared in the glovebox. The flask was carefully evacuated, then sealed with the Schlenk adapter, and transferred to the glovebox along with a couple of Teflon bottles. Undissolved material was precipitated at room temperature with a centrifuge at 5000 rpm for 30 min, using clear crude solution for purification. Hexane and ethanol were added, and the mixture was centrifuged at 4000 rpm for 15 min for purification (repeated 3 times).

Example 5

Properties and Device Performance of Surface Treated InP/ZnSe QDs

FIGS. 2A-2D depict four line graphs with binding energy of $2P_{3/2}$ level region for zinc atom ($Zn2P_{3/2}$) from X-ray photoelectron spectroscopy (XPS) with no surface treatment (ST) (FIG. 2A), Is level region for oxygen atom ($O_1s$) of InP/ZnSe from XPS without ST (FIG. 2B), $Zn2P_{3/2}$ from XPS with ST (FIG. 2C), and O1s of surface treated InP/ZnSe QDs from XPS with ST (FIG. 2D). As shown in these figures, an ultra-thin metal oxide or a metal oxide composite $ZnO_xSe_{1-x}$ formed on the outer shells of QDs was confirmed by XPS data. ZnO and oxide signals were increased with surface treated process on InP/ZnSe QDs compared to non-treated InP/ZnSe QDs.

FIGS. 3A-3C are a high-resolution transmission electron microscopy (TEM) images of an elementary mapping of Zn (FIG. 3A), Se (FIG. 3B), and O (FIG. 3C) on surface treated InP/ZnSe QDs. As shown in these figures, the oxygen signal is more dominant on the surface of QDs.

FIG. 4 is a line graph depicting a normalized phospholuminescence (PL) spectra of non-ST InP/ZnSe QDs (dotted line) and ST QDs (solid line). As shown in these figures, the defect emission at short wavelength (~500 nm) was reduced by the ST process.

FIGS. 5A-5C depict three line graphs depicting normalized PL at 77 Kelvin (K) and 298 K for InP/ZnSe/ZnS (FIG. 5A), ST InP/ZnSe with ultra-thin metal oxide composition on outer thin shell (InP/ZnSe/S.T.; FIG. 5B), and and overlay comparison of FIGS. 5A and 5B (FIG. 5C). As shown in these figures, the InP/ZnSe/ZnS quantum dots exhibit defect emission at 77 K, which comes from the III-V/II-V interface (FIG. 5A). This defect emission is reduced with the surface treated InP/ZnSe-ultra-thin metal oxide composition (FIGS. 5B and 5C).

FIG. 6 depicts the mole ratio of the total input zinc acetate dihydrate over the total number of InP/ZnSe QDs versus the QDs size for both the previous (triangles) and modified (circles) methods. The calculation of the total molar ratio zinc acetate dihydrate and InP/ZnSe QDs is dependent on QDs size. The required quantity of zinc acetate dihydrate becomes larger by increasing of QDs size as shown in FIG. 6. The larger amount of zinc acetate dihydrate improves the properties of the nanostructures containing the metal oxide shell over the smaller amount of zinc acetate dihydrate.

Table 1 shows the differences of zinc acetate dihydrate/QDs (diameter=5 nm) between the modified and previous versions.

TABLE 1

Comparison of acetate dihydrate/QDs between the modified and the previous versions.
Mole ratio (precursor/QDs (diameter = 5 nm))

| | |
|---|---|
| Modified - zinc acetate dihydrate:QDs | 2934:1 |
| Previous - zinc acetate dihydrate:QDs | 2132:1 |

FIG. 7 depicts the mole ratio of the total input zinc acetate dihydrate over the total number of InP/ZnSe QDs versus QDs size for the modified method.

FIG. 8 depicts the molar ratio of the total input zinc acetate dihydrate over the total number of InP/ZnSe QDs versus QDs size for both the previous (squares) and modified (circles) methods.

Surface treated InP/ZnSe QDs have superior optical properties including high QY and low trap emission compared to the best literature of InP/ZnSe as summarized in Table 2

TABLE 2

Optical properties of ST InP/ZnSe QDs vs InP/ZnSe, InP/ZnSe/ZnS with the best literature values.

| | QY/% | PL/nm | FWHM/nm | $I_{trap}/I_{core}$@77K |
|---|---|---|---|---|
| NNSY_InP/ZnSe | 95 | 537 | 38 | >0.07* |
| Liter._InP/ZnSe | 34 | 532 | 39 | ~0.22 |
| Liter._InP/ZnSe/ZnS | 95 | 528 | 36 | 10.05 |

TABLE 3

Device performance of InP/ZnSe QDs.

| EML | Max EQE(%) | EQE@10J | T50(Hr) |
|---|---|---|---|
| Pervious Surface treatment | 4.8 | 4.7 | 52 |
| Thin and/or composited metal oxide shell | 10.8 | 10.1 | 281 |

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method of making nanostructures, the nanostructures comprising a core/shell nanostructure comprising at least one shell, and a metal oxide on an outer shell of the core/shell nanostructure, wherein the metal oxide on the outer shell is less than 1 nm thick, the method comprising:
   (a) admixing a plurality of the core/shell nanostructures and solvent;
   (b) raising the temperature to between about 180° C. and about 360° C.; and
   (c) exposing the composition obtained in (b) to water in an amount that is a molar ratio of 2,000 to 180,000 water:core/shell nanostructures.

2. The method of claim 1, wherein the exposing the composition obtained in (b) to water is by admixing a metal hydrate.

3. The method of claim 2, wherein the metal hydrate is zinc acetate dihydrate.

4. The method of claim 2, wherein the molar ratio of the zinc acetate dihydrate to the core/shell nanostructures range is from about 1000 to about 90000, wherein the QDs size ranges from about 1 nm to 20 nm.

5. The method of claim 2, wherein the exposing the composition in (c) further comprises admixing a fluoride salt.

6. The method of claim 5, wherein the fluoride salt is zinc fluoride, Zirconium fluoride, Hafnium fluoride, Tungsten fluoride, Gallium fluoride, Lithium fluoride, Sodium fluoride, or Magnesium fluoride.

7. The method of claim 5, wherein the fluoride salt is an ionic liquid.

8. The method of claim 7, wherein the ionic liquid is an imidazolium, pyridinium, quaternary ammonium or quaternary phosphonium salt of fluoride, tetrafluoroborate or hexafluorophosphate.

9. The method of claim 5, wherein the fluoride salt is zinc fluoride and the wt. ratio of metal hydrate to zinc fluoride is about 2:1, wherein the metal hydrate is zinc acetate dihydrate.

* * * * *